(12) United States Patent
Kim et al.

(10) Patent No.: US 12,355,003 B2
(45) Date of Patent: Jul. 8, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Seungyoon Kim, Seoul (KR); Junghoon Jun, Hwaseong-si (KR); Sanghun Chun, Suwon-si (KR); Jeehoon Han, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 567 days.

(21) Appl. No.: 17/582,387

(22) Filed: Jan. 24, 2022

(65) Prior Publication Data

US 2022/0336421 A1 Oct. 20, 2022

(30) Foreign Application Priority Data

Apr. 16, 2021 (KR) .................. 10-2021-0050100

(51) Int. Cl.
*H01L 25/065* (2023.01)
*H01L 23/00* (2006.01)
(Continued)

(52) U.S. Cl.
CPC .......... *H01L 25/0657* (2013.01); *H01L 24/05* (2013.01); *H01L 25/18* (2013.01);
(Continued)

(58) Field of Classification Search
None
See application file for complete search history.

(56) References Cited

U.S. PATENT DOCUMENTS

| 8,765,598 B2 | 7/2014 | Smith et al. |
| 9,337,207 B2 | 5/2016 | Park et al. |
| (Continued) | | |

FOREIGN PATENT DOCUMENTS

| KR | 10-2010-0137349 A | 12/2010 |
| KR | 10-2019-0122372 A | 10/2019 |
| (Continued) | | |

*Primary Examiner* — Dale E Page
*Assistant Examiner* — Derek L Nielsen
(74) *Attorney, Agent, or Firm* — Harness, Dickey & Pierce, P.L.C.

(57) ABSTRACT

A semiconductor memory device including a substrate, first pad layers and a second pad layer on the substrate, a pattern structure including first openings on the first pad layers and a second opening on the second pad layer, and having first and second regions, gate electrodes on the pattern structure and each including a pad region, channel structures penetrating through the gate electrodes in the first region, gate contact plugs electrically connected to the gate electrodes through the pad region of each of the gate electrodes and extending in a vertical direction to penetrate the first openings and connected to the first pad layers, a source contact plug, extending in the vertical direction penetrating the second opening and connected to the second pad layer, and a source connection patter under the pattern structure and in contact with the source contact plug and the second pad layer may be provided.

20 Claims, 40 Drawing Sheets

(51) Int. Cl.
  *H01L 25/18* (2023.01)
  *H10B 41/27* (2023.01)
  *H10B 43/27* (2023.01)
(52) U.S. Cl.
  CPC .... *H01L 24/08* (2013.01); *H01L 2224/05007* (2013.01); *H01L 2224/05009* (2013.01); *H01L 2224/05011* (2013.01); *H01L 2224/05016* (2013.01); *H01L 2224/05078* (2013.01); *H01L 2224/05124* (2013.01); *H01L 2224/05138* (2013.01); *H01L 2224/05147* (2013.01); *H01L 2224/05166* (2013.01); *H01L 2224/05181* (2013.01); *H01L 2224/05184* (2013.01); *H01L 2224/05186* (2013.01); *H01L 2224/05562* (2013.01); *H01L 2224/05573* (2013.01); *H01L 2224/05666* (2013.01); *H01L 2224/05681* (2013.01); *H01L 2224/05686* (2013.01); *H01L 2224/08146* (2013.01); *H01L 2225/06544* (2013.01); *H01L 2924/01014* (2013.01); *H10B 41/27* (2023.02); *H10B 43/27* (2023.02)

(56) References Cited

U.S. PATENT DOCUMENTS

| | | |
|---|---|---|
| 9,666,281 B2 | 5/2017 | Sakakibara |
| 9,799,670 B2 | 10/2017 | Nishikawa et al. |
| 10,411,033 B2 | 9/2019 | Kim et al. |
| 2010/0320526 A1 | 12/2010 | Kidoh et al. |
| 2015/0221375 A1 | 8/2015 | Choi et al. |
| 2017/0323900 A1* | 11/2017 | Kanamori ............ H10D 88/00 |
| 2018/0261575 A1* | 9/2018 | Tagami ............... H01L 25/0657 |
| 2019/0326315 A1* | 10/2019 | Lee ..................... H10D 62/292 |
| 2019/0326316 A1* | 10/2019 | Son ..................... H10B 43/50 |
| 2019/0333931 A1* | 10/2019 | Jung ................... H10D 64/037 |
| 2020/0058667 A1* | 2/2020 | Baek .................... H10D 89/10 |
| 2020/0194456 A1 | 6/2020 | Baek |
| 2021/0057430 A1 | 2/2021 | Lee |

FOREIGN PATENT DOCUMENTS

| | | |
|---|---|---|
| KR | 10-2019-0123050 A | 10/2019 |
| KR | 10-2021-0023291 A | 3/2021 |

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority under 35 U.S.C. § 119 to Korean Patent Application No. 10-2021-0050100 filed on Apr. 16, 2021 in the Korean Intellectual Property Office, the disclosure of which is incorporated herein by reference in its entirety.

BACKGROUND

The present disclosure relates to semiconductor devices and/or data storage systems including the same.

In a data storage system requiring data storage, there is increasing demand for a semiconductor device, which may store high-capacity data. Accordingly, research into methods of increasing data storage capacity of a semiconductor device has been conducted. For example, a semiconductor device including three-dimensionally arranged memory cells, rather than two-dimensionally arranged memory cells, has been proposed as a way of increasing data storage capacity of a semiconductor device.

SUMMARY

Some example embodiments provide semiconductor devices having improved integration density and productivity.

Some example embodiments provide data storage systems including a semiconductor device having improved integration density and productivity.

According to an example embodiment, a semiconductor device may include a first structure including a substrate, circuit devices on the substrate, first pad layers on the circuit devices, and a second pad layer on the circuit devices, and a second structure on the first structure, wherein the second structure include a pattern structure including first openings on corresponding ones of the first pad layers, respectively, and a second opening on the second pad layer, the pattern structure having a first region and a second region, a stack structure including gate electrodes spaced apart from each other on the first region and the second region, the gate electrodes stacked on the pattern structure in a vertical direction and extending in a first direction perpendicular to the vertical direction, channel structures penetrating through the stack structure on the first region, each of the channel structures including a channel layer, separation regions penetrating through the stack structure on the first region and the second region and extending in the first direction, gate contact plugs penetrating through the stack structure, the gate contact plugs connected to the gate electrodes, respectively, and the gate contact plugs connected to the first pad layers through the first openings of the pattern structure, respectively, a source connection pattern being in contact with a lower surface of the pattern structure, and the source connection pattern having a hole between the second opening of the pattern structure and the second pad layer, a source contact plug spaced apart from the stack structure, the source contact plug extending into the hole of the source connection pattern through the second opening of the pattern structure, and the source contact plug connected to the second pad layer and the source connection pattern, and a through-insulating layer in the second opening of the pattern structure and surrounding a side surface of the source contact plug while extending partially into the hole of the source connection pattern.

According to an example embodiment, a semiconductor device may include a first structure including a substrate, circuit devices on the substrate, and first pad layers on the circuit devices, and a second pad layer on the circuit devices, and a second structure on the first structure, wherein the second structure includes a pattern structure including first openings on corresponding ones of the first pad layers, respectively, and a second opening on the second pad layer, the pattern structure having a first region and a second region, gate electrodes spaced apart from each other and stacked on the pattern structure in a vertical direction and extending in a first direction perpendicular to the vertical direction, each of the gate electrodes including a pad region having an upper surface, the upper surface including a portion exposed upwardly in the second region, channel structures penetrating through the gate electrodes on the first region, each of the channel structures extending in the vertical direction and including a channel layer, gate contact plugs electrically connected to the gate electrodes, respectively, through the pad region of each of the gate electrodes, the gate contact plugs extending in the vertical direction to pass through corresponding ones of the first openings of the pattern structure, respectively, and connected to corresponding ones of the first pad layers, respectively, a source contact plug spaced apart from the gate electrodes, extending in the vertical direction to pass through the second opening of the pattern structure, and connected to the second pad layer, and a source connection pattern having an upper surface in contact with a lower surface of the pattern structure, the source connection pattern in contact with the source contact plug and the second pad layer.

According to an example embodiment, a data storage system may include a semiconductor storage device including a first structure including a substrate, circuit devices on the substrate, and first pad layers on the circuit devices, and a second pad layer on the circuit devices, a second structure on the first structure, the second structure including a pattern structure including first openings on corresponding ones of the first pad layers, respectively, and a second opening on the second pad layer, the pattern structure having a first region and a second region, gate electrodes spaced apart from each other and stacked on the pattern structure in a vertical direction and extending in a first direction perpendicular to the vertical direction, each of the gate electrodes including a pad region having an upper surface, the upper surface including a portion exposed upwardly in the second region, channel structures penetrating through the gate electrodes on the first region, each of the channel structures extending in the vertical direction and including a channel layer, gate contact plugs electrically connected to the gate electrodes, respectively, through the pad region of each of the gate electrodes, the gate contact plugs extending in the vertical direction to pass through corresponding ones of the first openings of the pattern structure, respectively, and connected to corresponding ones of the first pad layers, respectively, a source contact plug spaced apart from the gate electrodes, extending in the vertical direction to pass through the second opening of the pattern structure, and connected to the second pad layer, and a source connection pattern having an upper surface in contact with a lower surface of the pattern structure and in contact with the source contact plug and the second pad layer, and an input/output pad electrically connected to the circuit devices, and a controller electrically connected to the semiconductor storage device through the input/output pad and configured to control the semiconductor storage device.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, some example embodiments will be described with reference to the accompanying drawings.

Figure 1A:
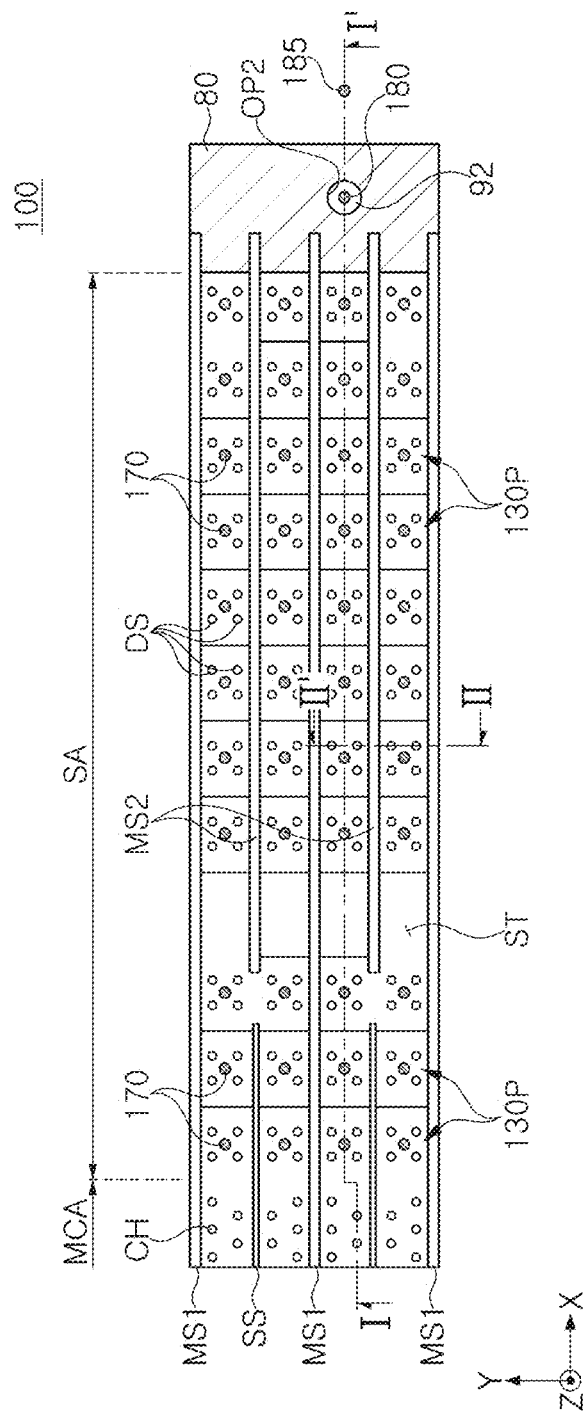
FIGS. 1A, 1B, 2A, and 2B are schematic plan views of a semiconductor device according to some example embodiments.
Figure 1B:
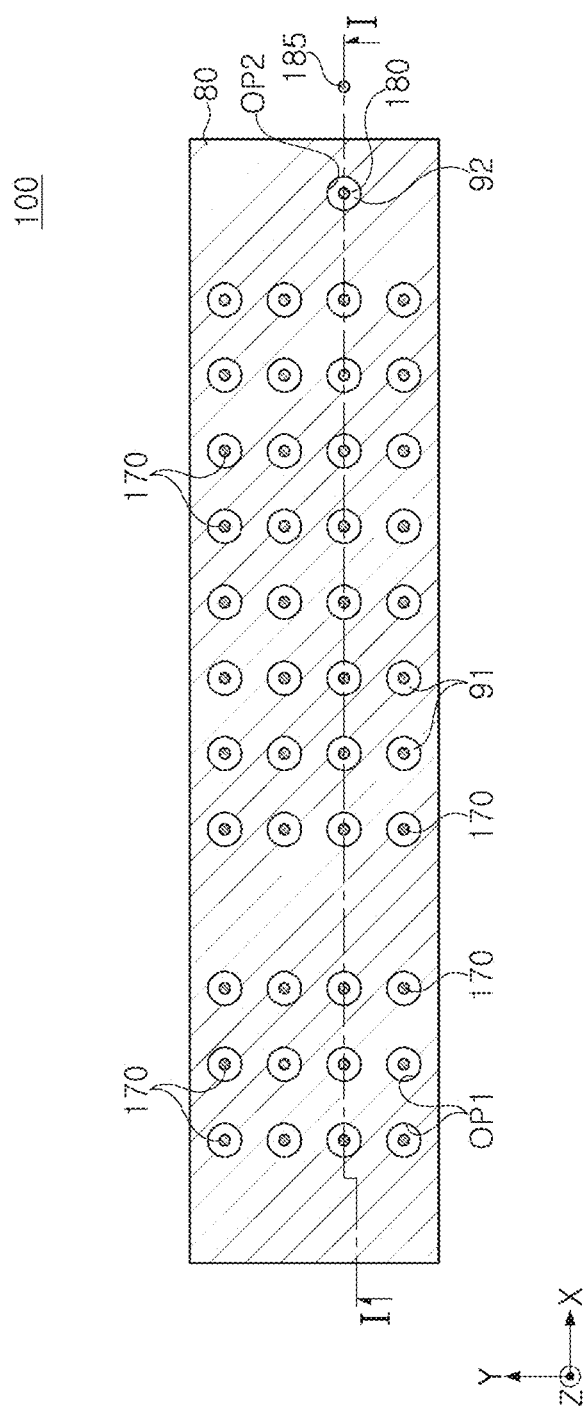
Figure 2A:
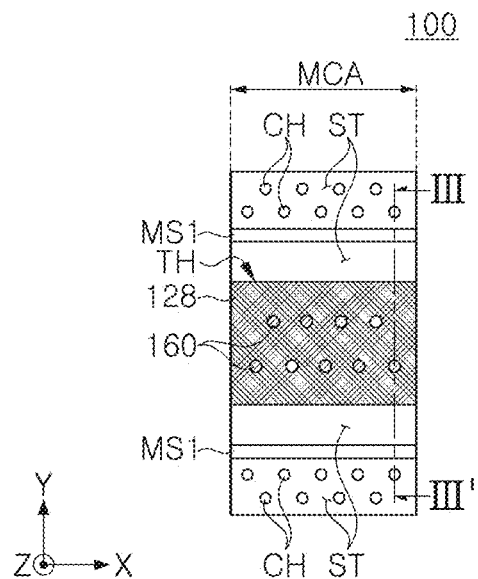
Figure 2B:
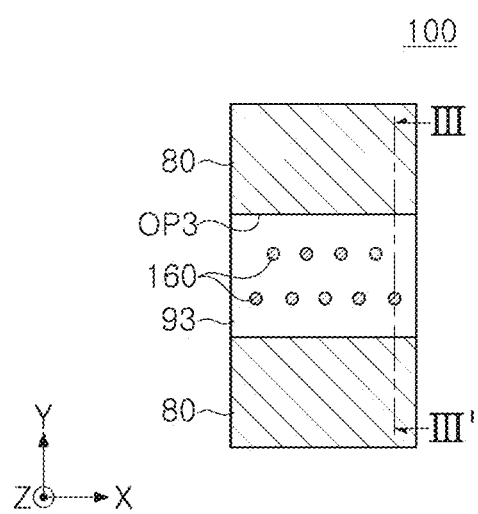

FIGS. 1A, 1B, 2A, and 2B are schematic plan views of a semiconductor device according to some example embodiments. FIG. 1B illustrates components of FIG. 1A and is a plan view at a height of a component represented by "80" of FIG. 1A. FIG. 2B illustrates some components of FIG. 2A and is a plan view at a height of a component represented by "80" of FIG. 2A. FIG. 2A illustrates a portion of a region extending from a region represented by "MCA" of FIG. 1A.

Figure 3A:
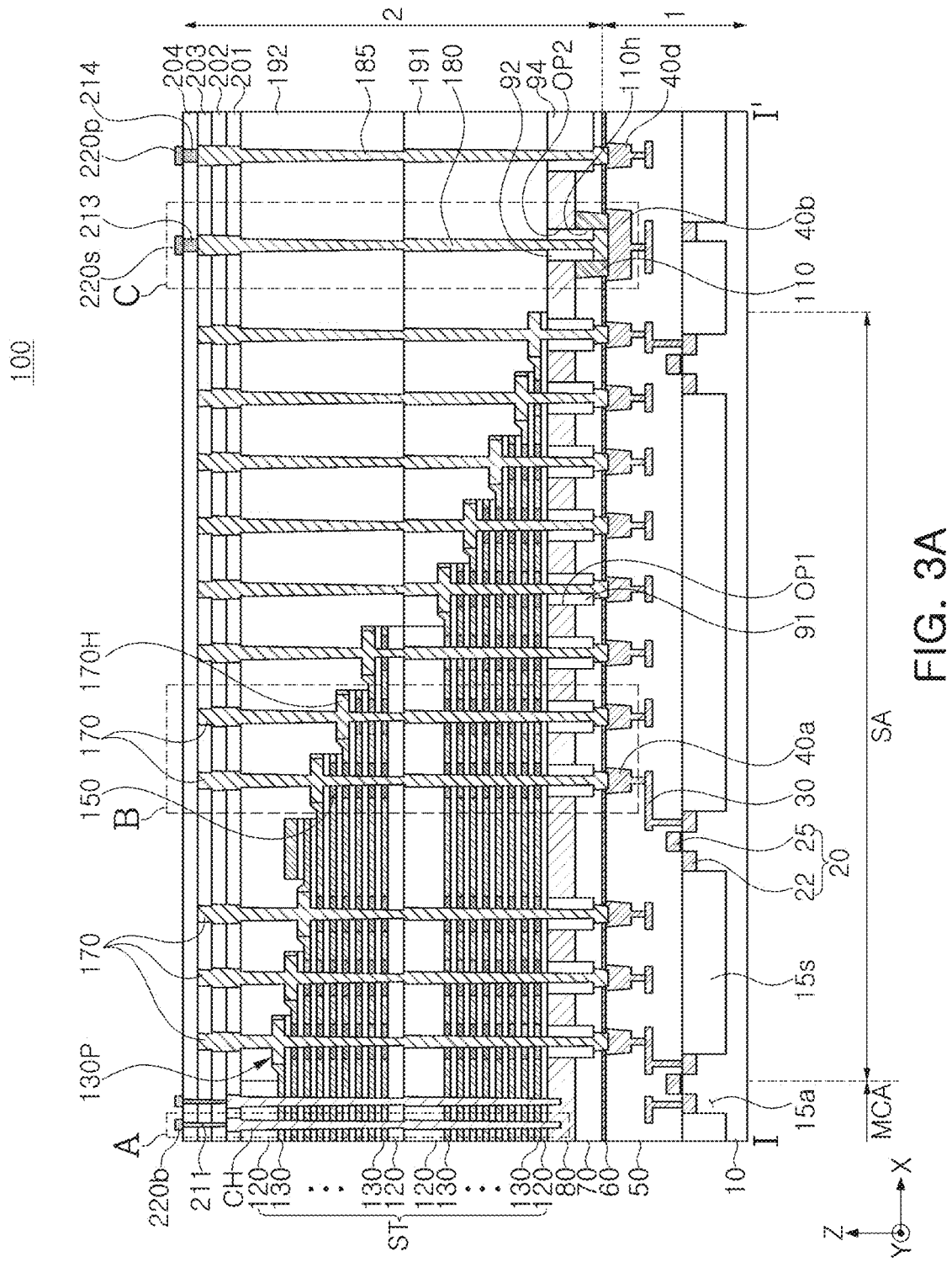
FIGS. 3A, 3B, and 3C are schematic cross-sectional views of a semiconductor device according to some example embodiments.
Figure 3B:
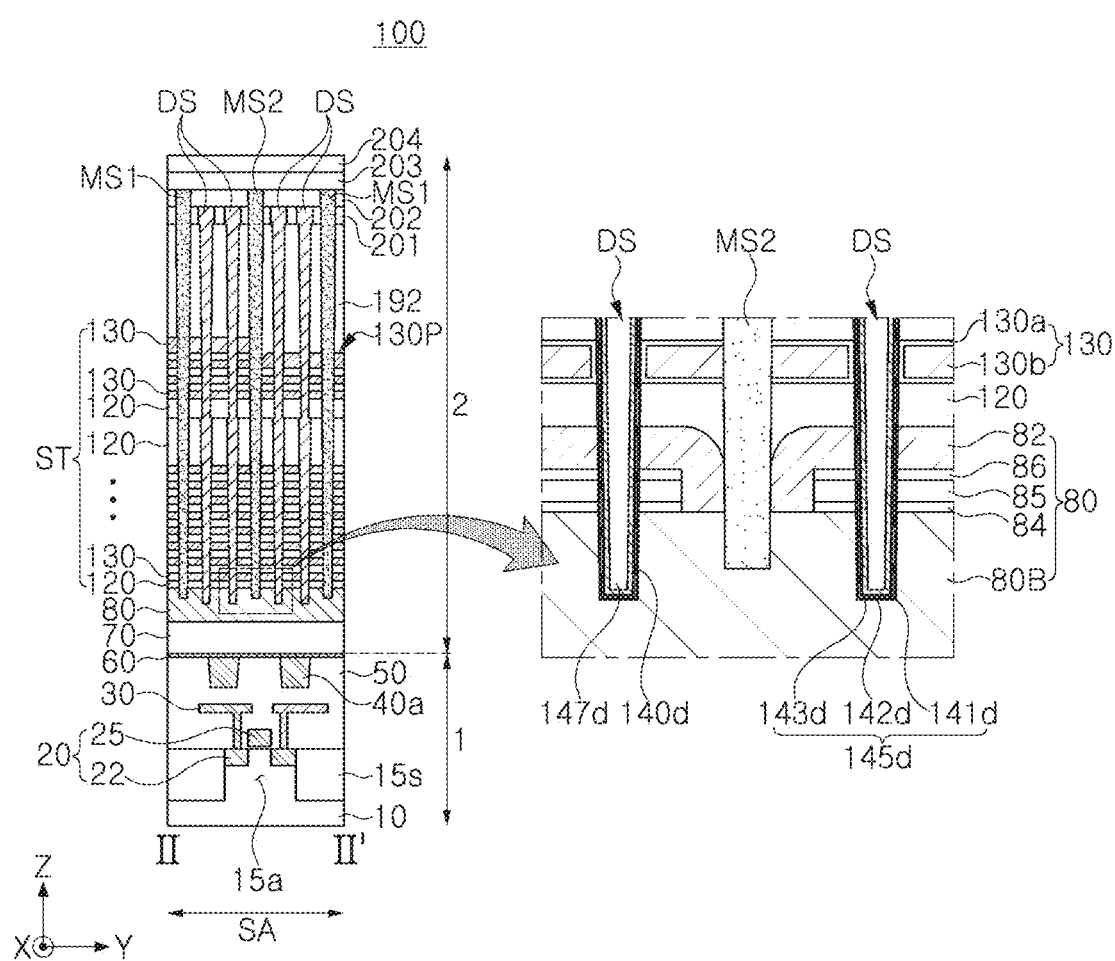
Figure 3C:
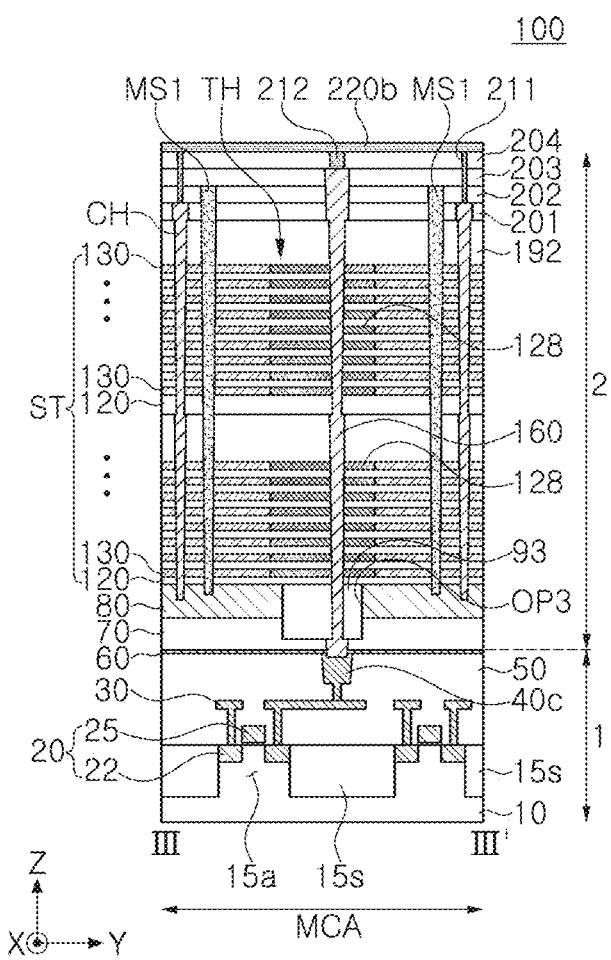

FIGS. 3A, 3B, and 3C are schematic cross-sectional views of semiconductor devices according to some example embodiments. FIG. 3A is a cross-sectional view taken along line I-I' of FIGS. 1A and 1B, FIG. 3B is a cross-sectional view taken along line II-II' of FIG. 1A, and FIG. 3C is a cross-sectional view taken along line III-III' of FIGS. 2A and 2B.

Figure 4A:
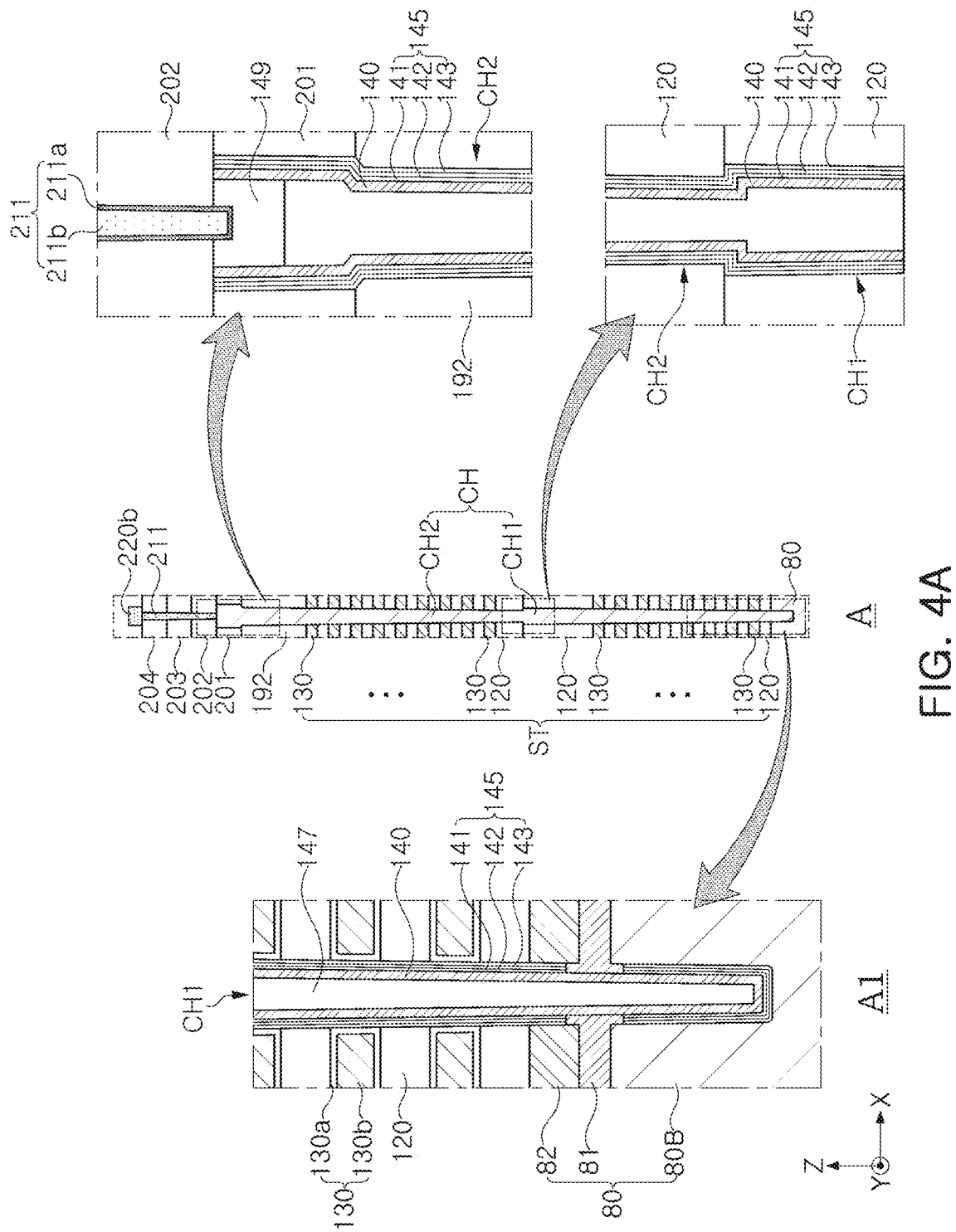
FIGS. 4A, 4B, and 4C are partially enlarged views of regions of a semiconductor device according to some example embodiments.
Figure 4B:
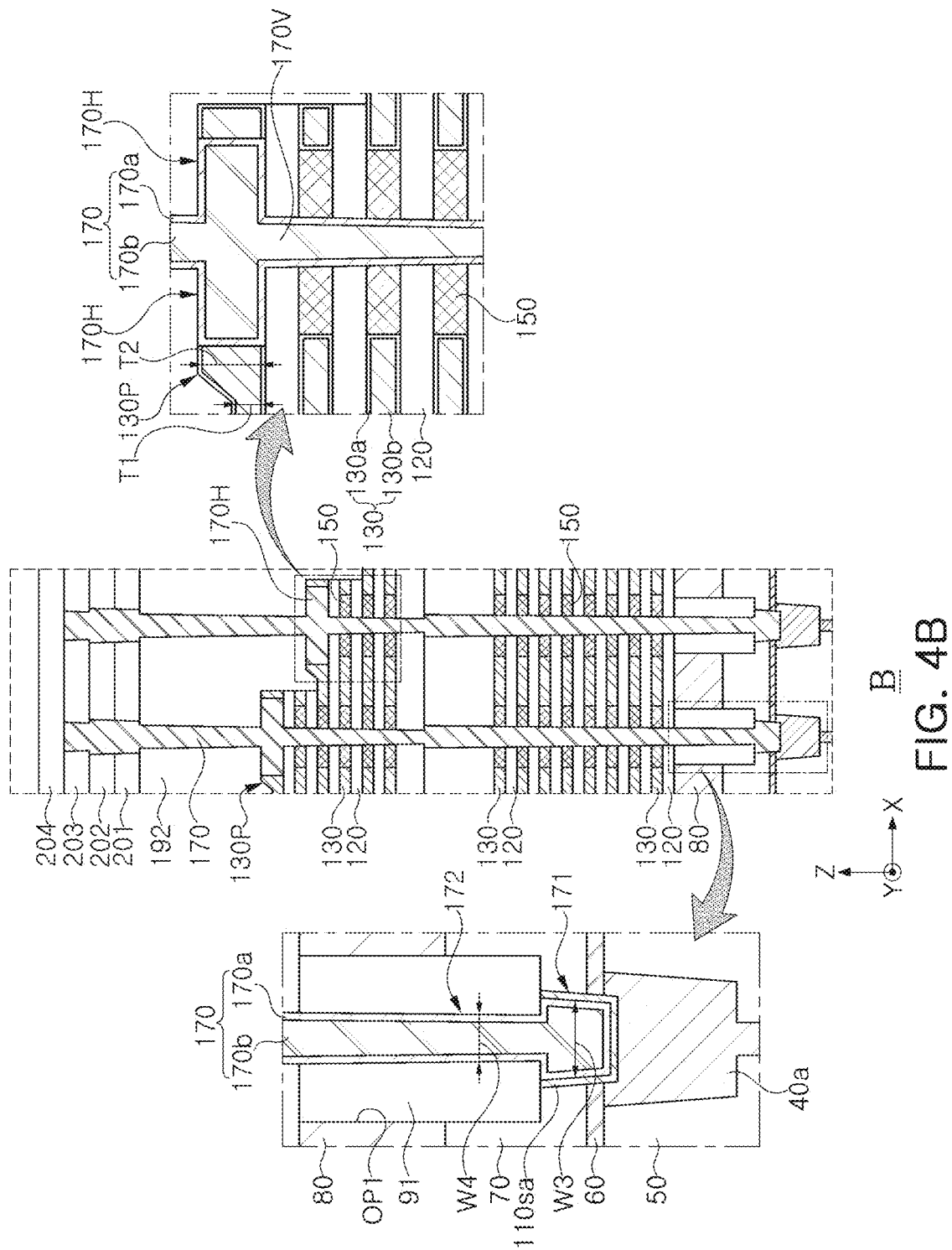
Figure 4C:
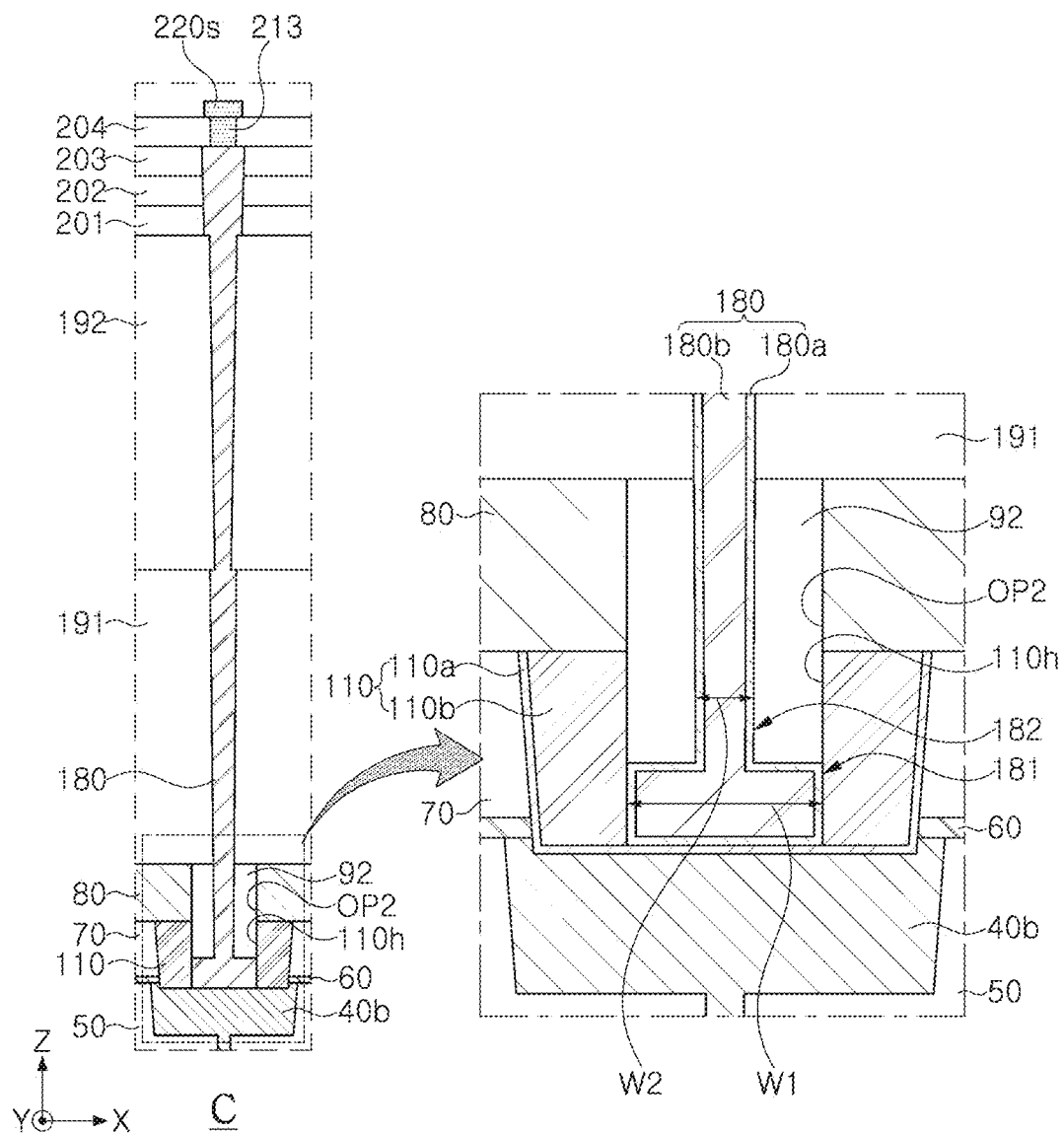

FIGS. 4A, 4B, and 4C are partially enlarged views illustrating regions of a semiconductor device according to some example embodiments. FIG. 4A is an enlarged view of region "A" of FIG. 3A, FIG. 4B is an enlarged view of region "B" of FIG. 3A, and FIG. 4C is an enlarged view of region "C" of FIG. 3A.

Referring to FIGS. 1A to 4C, a semiconductor device 100 may include a first structure 1 including a substrate 10 and a second structure 2 including a pattern structure 80. The second structure 2 may be disposed on the first structure 1.

The first structure 1 may include the substrate 10, device isolation layers 15s defining an active region 15a on the substrate 10, circuit devices 20 disposed on the substrate 10, circuit interconnections 30 electrically connected to the circuit devices 20, and pad layers 40a, 40b, 40c, and 40d electrically connected to the circuit interconnections 30. The first structure 1 may further include a lower capping insulating layer 50 covering the circuit devices 20, the circuit interconnections 30, and the pad layers 40a, 40b, 40c and 40d on the substrate 10, and an etch-stop layer 60 on the lower capping insulating layer 50.

The substrate 10 may include a semiconductor material, for example, a group IV semiconductor, a group III-V compound semiconductor, or a group II-VI compound semiconductor. The substrate 10 may be provided as a bulk wafer or an epitaxial layer. The device isolation layers 15s may be disposed in the substrate 10, and source/drain regions 22 including impurities may be disposed in a portion of the active region 15a.

Each of the circuit devices 20 may include a transistor including a source/drain region 22 and a circuit gate electrode 25. The source/drain regions 22 may be disposed on opposite sides adjacent to the circuit gate electrode 25 in the active region 15a. The circuit devices 20 may further include a dielectric layer disposed between the active region 15a and the circuit gate electrode 25.

The circuit interconnections 30 may be electrically connected to the circuit devices 20. The circuit interconnections 30 may include contact plugs extending in a Z direction and be connected to the source/drain regions 22. In a region (not illustrated), the circuit interconnections 30 may also be electrically connected to the circuit gate electrode 25. In some example embodiments, the circuit interconnections 30 may include a plurality of layers disposed on different levels and connected to each other by vias. The circuit interconnections 30 may be formed of a conductive material, for example, a metal material such as tungsten (W), titanium (Ti), copper (Cu), aluminum (Al), molybdenum (Mo), ruthenium (Ru), or the like.

The pad layers 40a, 40b, 40c, and 40d may be connected to the circuit interconnections 30 and may be electrically connected to the circuit devices 20, but the second pad layer 40b may not be directly connected to the circuit devices 20 therebelow through lower contacts. The pad layers 40a, 40b, 40c, and 40d may include a first pad layer 40a, a second pad layer 40b, a third pad layer 40c, and a fourth pad layer 40d. The pad layers 40a, 40b, 40c, and 40d may include at least one of metal or metal nitride. The pad layers 40a, 40b, 40c, and 40d may include a conductive material, for example, a metal material such as tungsten (W), copper (Cu), aluminum (Al), molybdenum (Mo), ruthenium (Ru), or the like. The pad layers 40a, 40b, 40c, and 40d may allow a plurality of contact plugs, which are disposed on the second structure 2 and extending downwardly, to be stably connected to the first structure 1.

The lower capping insulating layer 50 may cover the substrate 10, the circuit devices 20, the circuit interconnections 30, and the pad layers 40a, 40b, 40c, and 40d. The lower capping insulating layer 50 may be formed of an insulating material (e.g., silicon oxide or silicon nitride). The lower capping insulating layer 50 may include a plurality of insulating layers.

The etch-stop layer 60 may be disposed on the lower capping insulating layer 50. The etch-stop layer 60 may include an insulating material, for example, at least one of silicon oxide, silicon nitride, or silicon oxynitride.

The second structure 2 may include a pattern structure 80 on the first structure 1, a stack structure ST including gate electrodes 130 on the pattern structure 80, separation regions MS1 and MS2 penetrating through the stack structure ST and separating the gate electrodes 130 from each other, a channel structure CH penetrating through the stack structure ST and including a channel layer 140, a through-contact plug 160 penetrating through a through-region TH of the stack structure ST, a gate contact plug 170 penetrating through the stack structure ST and connected to the gate electrode 130, a source contact plug 180 spaced apart from the stack structure ST and electrically connected to the pattern structure 80, and a source connection pattern 110 connected to the source contact plug 180 below the pattern structure 80. The second structure 2 may further include a lower insulating layer 70 below the pattern structure 80, through-insulating layers 91, 92, and 93 penetrating through the pattern structure 80, interlayer insulating layers 120 stacked alternately with the gate electrodes 130 and constituting the stack structure ST, a dummy vertical structure DS penetrating through the stack structure ST and including a dummy channel layer 140d, an upper separation region SS separating upper gate electrodes 130 from each other, a buffer insulating pattern 150 insulating a portion of the gate electrodes 130 and the gate contact plug 170 from each other, capping insulating layers 191 and 192 covering the stack structure ST, a peripheral contact plug 185 penetrating through the capping insulating layers 191 and 192, upper insulating layers 201, 202, 203, and 204, and upper interconnections 220b, 220s, and 220p.

A first region MCA of the pattern structure 80 may be a region in which the gate electrodes 130 are stacked to be spaced apart from each other in the Z direction and the channel structures CH are disposed, and may be a region in which memory cells are disposed. A second region SA of the pattern structure 80 may be a region in which the gate electrodes 130 extend by different lengths and a gate contact plug 170 is disposed, and may be a region for electrically connecting to the memory cells to the circuit devices 20 of the first structure 1. The gate electrodes 130 may be arranged in a staircase shape on the second region SA.

The pattern structure 80 may be disposed on the first structure 1, and may include first openings OP1, a second opening OP2, and a third opening OP3. The first openings OP1 may be disposed on the first pad layers 40a, the second opening OP2 may be disposed on the second pad layer 40b, and the third opening OP3 may be disposed on the third pad layer 40c. The through-insulating layers 91, 92, and 93 include a first through-insulating layer 91 filling the first openings OP1, a second through-insulating layer 92 filling the second opening OP2, and a third through-insulating layer 93 filling the opening OP3. The through-insulating layers 91, 92, and 93 may penetrate through the pattern structure 80 to extend downwardly of a lower surface of the pattern structure 80. The through-insulating layers 91, 92, and 93 may include an insulating material, for example, at least one of silicon oxide, silicon nitride, or silicon oxynitride. The first structure 1 may further include an external insulating layer 94 in contact with an external side surface of the pattern structure 80.

At least a portion of the pattern structure 80 may be formed of, for example, polycrystalline silicon having N-type conductivity. In the pattern structure 80, a region formed of polycrystalline silicon having N-type conductivity may be a common source region. In some example embodiments, the pattern structure 80 may include a base pattern 80B, a first pattern 81 on the base pattern 80B, and a second pattern 82 on the first pattern 81, as illustrated in FIG. 4A. At least one of the base pattern 80B, the first pattern 81, or the second pattern 82 may include silicon. As illustrated in FIG. 3B, the pattern structure 80 may further include sacrificial insulating patterns 84, 85, and 86 disposed to be parallel to the first pattern 81 on the base pattern 80B. The sacrificial insulating patterns 84, 85, and 86 may be disposed in the second regions SA, and may include silicon oxide, silicon nitride, silicon carbide, or silicon oxynitride. The sacrificial insulating patterns 84, 85, and 86 may include first to third sacrificial patterns 84, 85, and 86 sequentially stacked. In some example embodiments, the first and third sacrificial insulating patterns 84 and 86 may include silicon oxide, and the second sacrificial insulating pattern 85 may include silicon nitride. In some example embodiments, the patterned structure 80 may be formed as a single layer, for example, a silicon layer.

A lower insulating layer 70 may be disposed below the pattern structure 80. The lower insulating layer 70 may be disposed on the etch-stop layer 60. The lower insulating layer 70 may include an insulating material, for example, at least one of silicon oxide, silicon nitride, or silicon oxynitride.

The gate electrodes 130 may be stacked to be spaced apart from each other in the Z direction on the pattern structure 80 to constitute the stack structure ST. The gate electrodes 130 may extend in the X direction. The gate electrodes 130 may include lower gate electrodes constituting a gate of a ground select transistor, memory gate electrodes constituting a plurality of memory cells, and upper gate electrodes constituting gates of the string select transistors. The number of the memory gate electrodes, constituting the memory cells, may be determined depending on capacity of the semiconductor device 100. In some example embodiments, the gate electrodes 130 may be disposed above the upper gate electrodes and/or below the lower gate electrodes, and may further include a gate electrode constituting an erase transistor used for an erase operation based on gate-induced drain leakage (GIDL).

The gate electrodes 130 may be vertically spaced apart from each other and stacked in the first region MCA, and extend upwardly of the second region SA from a portion above the first region MCA by different lengths to form a staircase-shaped step structure. As illustrated in FIG. 3A, the gate electrodes 130 may form a step structure between the gate electrodes 130 in the X direction, and may be disposed to have a step structure even in a Y direction.

Due to the step structure, the lower gate electrode 130 may extend further than the overlying gate electrode 130 to have regions exposed upwardly from the interlayer insulating layers 120, and the exposed regions may be referred to as pad regions 130P. In each of the gate electrodes 130, the pad region 130P may be a region including an end portion of the gate electrode 130 in the X direction. The pad region 130P may correspond to a portion of an uppermost gate electrode 130 disposed in each region, among the gate electrodes 130 constituting the stack structure ST in the second region SA. The gate electrodes 130 may be connected to the gate contact plugs 170 in the pad regions 130P, respectively.

The gate electrodes 130 may have an increased thickness in the pad regions 130P. The thickness of each of the gate electrodes 130 may be increased in such a manner that a level of an upper surface is increased while a level of a lower surface is constant. As illustrated in FIG. 4B, the gate electrodes 130 may extend from the first region MCA toward the second region SA to a first thickness T1 and may have a second thickness T2, greater than the first thickness T1, in the pad regions 130P, as illustrated in the enlarged portion of FIG. 4B.

The gate electrodes 130 may be separated from each other in the Y direction by the separation region MS1 extending in the X direction. The gate electrodes 130 between a pair of separation regions MS1 may constitute a single memory block, but a range of the memory block is not limited thereto. Each of the gate electrodes 130 may include a first layer 130a and a second layer 130b. The first layer 130a may cover the upper and lower surfaces of the second layer 130b and may extend between the channel structure CH and the second layer 130b. The first layer 130a may include a high-k dielectric material such as aluminum oxide (AlO), and the second layer 130b may include at least one of titanium (Ti), titanium nitride (TiN), tantalum (Ta), or tantalum nitride (TaN), tungsten (W), or tungsten nitride (WN). In some example embodiments, the gate electrodes 130 may include polycrystalline silicon or a metal-semiconductor compound.

The interlayer insulating layers 120 may be disposed between the gate electrodes 130, and may constitute a stack structure ST. Similar to the gate electrodes 130, the interlayer insulating layers 120 may be spaced apart from each other in the Z direction and may be disposed to extend in the X direction. The interlayer insulating layers 120 may include an insulating material such as silicon oxide or silicon nitride.

The stack structure ST may include a lower stack structure and an upper stack structure on the lower stack structure. Gate electrodes 130 of the lower stack structure may constitute a first gate stack group, and gate electrodes 130 of the upper stack structure may constitute a second gate stack group. In some example embodiments, an uppermost interlayer insulating layer 120 of the lower stack structure and a lowermost interlayer insulating layer 120 of the upper stack structure each may have a greater thickness than the other interlayer insulating layers 120.

The separation regions MS1 and MS2 may extend in the X direction through the gate electrodes 130. The separation regions MS1 and MS2 may be parallel to each other. The separation regions MS1 and MS2 may pass through the entirety of the gate electrodes 130 of the stack structure ST and be connected to the pattern structure 80. The first separation regions MS1 may extend in a single linear form in the X direction, and the second separation regions MS2 may intermittently extend between a pair of first separation regions MS1 or may be disposed only in some regions. However, in example embodiments, the arrangement order and number of the first and second separation regions MS1 and MS2 are not limited to those illustrated in FIG. 1A. The separation regions MS1 and MS2 may be formed of an insulating material, for example, silicon oxide.

The upper separation regions SS may extend between the first separation regions MS1 in the first region MCA in the X direction. The upper separation regions SS may separate the upper gate electrodes 130, among the gate electrodes 130, from each other in the Y direction. However, the number of gate electrodes 130 separated by the upper separation regions SS may vary according to example embodiments. The upper gate electrodes 130 separated by the upper separation regions SS may constitute different string select lines. The upper separation regions SS may include an insulating material, for example, silicon oxide, silicon nitride, or silicon oxynitride.

As illustrated in FIG. 1A, the channel structures CH may each constitute a single memory cell string and may be spaced apart from each other in rows and columns on the first region MCA. The channel structures CH may form a grid pattern or may be disposed in a zigzag pattern in one direction. The channel structures CH may have a columnar shape, and may have inclined sides having widths decreased in a direction toward the pattern structure 80.

The channel structures CH may include first and second channel structures CH1 and CH2 vertically stacked, as illustrated in FIG. 4A. The channel structures CH may have a form in which first channel structures CH1 penetrating through the lower stack structure of the gate electrodes 130, and second channel structures CH penetrating through the upper stack structure of the gate electrodes 130 are connected to each other, and may have a bent portion formed by a difference in width in a connection region. However, the number of channel structures stacked in the Z direction may vary according to example embodiments.

As illustrated in the enlarged view of FIG. 4A, the channel layer 140 may be disposed in the channel structures CH. In the channel structures CH, the channel layer 140 may be formed in an annular shape surrounding the channel buried insulating layer 147 therein. The channel layer 140 may be connected to the first pattern 81 therebelow. The channel layer 140 may include a semiconductor material such as polycrystalline silicon or single crystal silicon.

The gate dielectric layer 145 may be disposed between the gate electrodes 130 and the channel layer 140. The gate dielectric layer 145 may include a tunneling layer 141, a data storage layer 142, and a blocking layer 143 sequentially stacked on the channel layer 140. The tunneling layer 141 may tunnel charges to the data storage layer 142, and may include, for example, silicon oxide ($SiO_2$), silicon nitride ($Si_3N_4$), silicon oxynitride (SiON), or combinations thereof. The data storage layer 142 may be a charge trap layer or a floating gate conductive layer. The blocking layer 143 may include silicon oxide ($SiO_2$), silicon nitride ($Si_3N_4$), silicon oxynitride (SiON), a high-k dielectric material, or combinations thereof. In some example embodiments, at least a portion of the gate dielectric layer 145 may extend in a horizontal direction along the gate electrodes 130. The channel pad 149 may be disposed only on an upper end of the second channel structure CH2. The channel pads 149 may include, for example, doped polycrystalline silicon.

As illustrated in FIG. 4A, a portion of the channel structures CH may extend into the base pattern 80B through the first pattern 81 and the second pattern 82. The first pattern 81 may be in contact with the channel layer 140 through the gate dielectric layer 145 below the stack structure ST. The first pattern 81 may be directly connected to the channel layer 140 on a periphery of the channel layer 140.

The dummy vertical structure DS may be disposed in the second region SA and may have a structure the same as or similar to a structure of the channel structure CH, but may not perform any substantial function in the semiconductor device 100. The dummy vertical structure DS may serve as a support structure to improve structural stability of the stack structure ST. The dummy vertical structure DS may be disposed in rows and columns in the pad regions 130P of the gate electrodes 130, as illustrated in FIG. 1A. As illustrated in FIG. 3B, the dummy vertical structure DS may be formed in an annular shape in which the dummy channel layer 140d surrounds the dummy channel buried insulating layer 147d therein. The dummy channel layer 140d may be formed of a semiconductor material such as polycrystalline silicon or single-crystalline silicon. The dummy channel layer 140d may be spaced apart from the first pattern 81 of the pattern structure 80. The dummy vertical structure DS may further include a dummy gate dielectric layer 145d disposed between the gate electrodes 130 and the dummy channel layer 140d. In some example embodiments, the dummy vertical structure DS may have a structure different from that of the channel structure CH, and for example, an inside of the dummy vertical structure DS may be formed of an insulating material such as silicon oxide.

As illustrated in FIG. 3C, the through-contact plug 160 may penetrate through the through-region TH of the stack structure ST in the first region MCA in the Z direction to be connected to the third pad layer 40c through the third opening OP3 of the pattern structure 80. The through-contact plug 160 may penetrate through the first to third upper insulating layers 201, 202, and 203, the second capping insulating layer 192, and the third through-insulating layer 93 to extend downwardly. The through-contact plug 160 may include at least one of metal or metal nitride. The through-region TH may be a region for electrically connecting the channel structures CH of the second structure 2 and the circuit devices 20 of the first structure 1 to each other. The through-region TH may include sacrificial insulating layers 128 and interlayer insulating layers 120. The sacrificial insulating layers 128 may be disposed on substantially the same level as the gate electrodes 130. As illustrated in FIG. 2A, the through-region TH may be disposed in the center of a pair of first separation regions MS1 adjacent to each other in the Y direction and may be spaced apart from the first separation regions MS1. The sacrificial insulating layers 128 may remain in the through-region TH.

The gate contact plugs 170 may penetrate through uppermost gate electrodes 130 and buffer insulating patterns 150 below the uppermost gate electrodes 130 in the second region SA. The gate contact plugs 170 may penetrate through the pad regions 130P of the gate electrodes 130 and may be electrically connected to the gate electrodes 130 through the pad regions 130P. The gate contact plugs 170 may pass through at least a portion of the second capping insulating layer 192 and may be connected to the upwardly exposed pad regions 130P of the gate electrodes 130, respectively. The gate contact plugs 170 may be connected to the first pad layer 40a in the first structure 1 through the first opening OP1 of the pattern structure 80 below the stack structure ST. A side surface of each of the gate contact plugs 170 may include a portion bent below the first openings OP1. The gate contact plugs 170 may be spaced apart from the pattern structure 80 by the first through-insulating layer 91 and may be electrically separated from each other.

As illustrated in FIG. 4B, each of the gate contact plugs 170 may include a vertical extension portion 170V, vertically extending in the Z direction, and a horizontal extension portion 170H horizontally extending from the vertical extension portion 170V and in contact with the pad regions 130P. The vertical extension portion 170V may have a cylindrical shape, a width of which decreases in a direction toward the substrate 10 due to an aspect ratio. The horizontal extension portion 170H may be disposed along a periphery of the vertical extension portion 170V. The horizontal extension portion 170H may have a shape protruding from the vertical extension portion 170V in a horizontal direction.

As illustrated in FIG. 4B, each of the gate contact plugs 170 may have a first gate plug portion 171 below the pattern structure 80 and a second gate plug portion 172 on the first gate plug portion 171. The vertical extension portion 170V may extend upwardly, with respect to the pattern structure 80, from the second gate plug portion 172 in the Z direction. A third width W3 of the first gate plug portion 171 may be greater than a fourth width W4 of the second gate plug portion 172. The gate contact plugs 170 may further include a conductive liner 110sa surrounding a side surface and a lower surface of the first gate plug portion 171.

The gate contact plugs 170 may include at least one of metal or metal nitride. The gate contact plugs 170 may include a first conductive liner 170a and a first conductive plug 170b. The first conductive liner 170a may cover a side surface and a lower surface of the first conductive plug 170b. The first conductive liner 170a may include a bent portion bent in a horizontal direction from a portion extending in the Z direction. The conductive liner 110sa and the first conductive liner 170a may include at least one of, for example, titanium (Ti), titanium nitride (TiN), tantalum (Ta), or tantalum nitride (TaN). The first conductive plug 170b may include a metal material, for example, at least one of tungsten (W), titanium (Ti), copper (Cu), aluminum (Al), or alloys thereof.

The buffer insulating patterns 150 may surround side surfaces of the gate contact plugs 170 below the pad regions 130P. Internal side surfaces of the buffer insulating patterns 150 may surround the gate contact plugs 170, and external side surfaces of the buffer insulating patterns 150 may be surrounded by the gate electrodes 130. The gate contact plugs 170 may be physically and electrically connected to a single gate electrode 130 and electrically separated from the other gate electrodes 130 therebelow by the buffer insulating patterns 150. For example, the buffer insulating patterns 150 may insulate the gate electrodes 130, which is disposed below the horizontal extension portion 170H of the gate contact plug 170, and the vertical extension portion 170V from each other. The buffer insulating patterns 150 include an insulating material, for example, at least one of silicon oxide, silicon nitride, or silicon oxynitride.

The source contact plug 180 may be spaced apart from the stack structure ST and penetrate through the first capping insulating layer 191 and the second capping insulating layer 192. The source contact plug 180 may extend in the Z direction to pass through the second opening OP2 of the pattern structure 80 and to be connected to the second pad layer 40b. The source contact plug 180 may be connected to the source connection pattern 110 below the pattern structure 80. A lower surface of the source contact plug 180 may be disposed on a lower level than a lower surface of the pattern structure 80. The source contact plug 180 may be spaced apart from the pattern structure 80 by the second through-insulating layer 92. The second through-insulating layer 92 may surround a side surface of the source contact plug 180 while extending partially into a hole 110h of the source connection pattern 110 from the second opening OP2 of the pattern structure 80. A lower portion, including a lower end of the source contact plug 180, may be surrounded by the source connection pattern 110 below the pattern structure 80. The source contact plug 180 may extend into the hole 110h of the source connection pattern 110. The source contact plug 180 may be electrically connected to the pattern structure 80 through the second pad layer 40b and the source connection pattern 110. The source contact plug 180 may be electrically connected to the circuit devices 20 through an overlying source interconnection 220s in a region (not illustrated). An electrical signal applied through the source contact plug 180 may be transmitted to the pattern structure 80 through the second pad layer 40b and/or the source connection pattern 110.

The source contact plug 180 may include a first plug portion 181 and a second plug portion 182 on the first plug portion 181 in the hole 110h of the source connection pattern 110. A first width W1 of the first plug portion 181 may be greater than a second width W2 of the second plug portion 182. The first plug portion 181 may be in direct contact with the source connection pattern 110, and the second plug portion 182 may be horizontally spaced apart from the source connection pattern 110. The source contact plug 180 may have a side surface having a bent portion on a level between an uppermost gate electrode 130 of the lower stack structure and a lowermost gate electrode 130 of the upper stack structure.

The source contact plug 180 may include at least one of metal or metal nitride. The source contact plug 180 may include a second conductive liner 180a and a second conductive plug 180b. The second conductive liner 180a may cover a side surface and a lower surface of the second conductive plug 180b. The second conductive liner 180a may or a vertical portion and a bent portion, the vertical portion extending downwardly than the pattern structure in the Z direction, the bent portion bent toward the source connection pattern 110 from the vertical portion. The second conductive liner 180a may include at least one of, for example, titanium (Ti), titanium nitride (TiN), tantalum (Ta), and tantalum nitride (TaN). The second conductive plug 180b may include a metal material, for example, at least one of tungsten (W), titanium (Ti), copper (Cu), aluminum (Al), or alloys thereof. According to some example embodiments, the second conductive liner 180a may be omitted.

The source connection pattern 110 may be disposed below the pattern structure 80. An upper surface of the source connection pattern 110 may be in contact with a portion of a lower surface of the pattern structure 80, and a lower surface of the source connection pattern 110 may be in contact with the second pad layer 40b. The source connection pattern 110 may be connected to the second pad layer 40b through the etch-stop layer 60. The source connection pattern 110 may be disposed by partially recessing an upper portion of the second pad layer 40b. The source connection pattern 110 may be in the form of a via in a center of which a hole 110h is provided. The hole 110h of the source connection pattern 110 may be disposed between the second opening OP2 of the pattern structure 80 and the second pad layer 40b. A portion of the second through-insulating layer 92 may be disposed in the hole 110h. The source connection pattern 110 may be in direct contact with a side surface of the first plug portion 181 of the source contact plug 180. The source connection pattern 110 may provide an electrical connection path between the source contact plug 180 and the pattern structure 80. A width of the source connection pattern 110 may be greater than a width of the second through-insulating layer 92.

The source connection pattern 110 may include a conductive liner 110a and a conductive connection pattern 110b. The conductive liner 110a may cover a side surface and a lower surface of the conductive connection pattern 110b. The hole 110h may penetrate through the conductive connection pattern 110b and may not penetrate through the conductive liner 110a. However, example embodiments are not limited thereto, and the hole 110h may penetrate through conductive liner 110a. The conductive liner 110a may include at least one of, for example, titanium (Ti), titanium nitride (TiN), tantalum (Ta), or tantalum nitride (TaN). The conductive connection pattern 110b may include a semiconductor material such as polycrystalline silicon or single-crystalline silicon. A metal-semiconductor compound layer such as titanium silicon (TiSi), tantalum silicon (TaSi), or tungsten silicon (WSi) may be further formed between the conductive liner 110a and the second pad layer 40b.

The peripheral contact plug 185 may be spaced apart from the stack structure ST, and penetrate through the first capping insulating layer 191 and the second capping insulating layer 192. The peripheral contact plug 185 may be spaced apart further from the stack structure ST than the source contact plug 180. The peripheral contact plug 185 may be connected to the fourth pad layer 40d of the first structure 1 through the external insulating layer 94. The peripheral contact plug 185 may extend downwardly through the first to third upper insulating layers 201, 202, and 203, the first and second capping insulating layers 191 and 192, and the external insulating layer 94. An upper portion of the peripheral contact plug 185 may have a structure similar to a structure of an upper portion of the source contact plug 180, and a lower portion of the peripheral contact plug 185 may have a structure similar to a structure of a lower portion of the gate contact plug 170. The peripheral contact plug 185 may include at least one of metal or metal nitride.

The capping insulating layers 191 and 192 may include a first capping insulating layer 191, covering the gate electrodes 130 of the lower stack structure on the pattern structure 80, and a second capping insulating layer 192 covering the gate electrodes 130 of the upper stack structure on the first capping insulating layer 191. The capping insulating layers 191 and 192 may be formed of an insulating material such as silicon oxide. The capping insulating layers 191 and 192 may include a plurality of insulating layers.

The upper insulating layers 201, 202, 203, and 204 may include first to fourth upper insulating layers 201, 202, 203, and 204 sequentially stacked on the capping insulating layers 191 and 192. The upper insulating layers 201, 202, 203, and 204 may be formed of an insulating material such as silicon oxide. In the upper insulating layers 201, 202, 203, and 204, a side surface of each of the through-contact plug 160, the gate contact plug 170, the source contact plug 180, and the peripheral contact plug 185 may include at least one bent portion.

The connection plugs 211, 212, 213, and 214 may be connected to upper ends of the contact plugs through some of the upper insulating layers 201, 202, 203 and 204. The connection plugs 211, 212, 213, and 214 may include a first bitline connection plug 211 electrically connected to the channel structure CH, a second bitline connection plug 212 electrically connected to the through-contact plug 160, a source connection plug 213 electrically connected to the source contact plug 180, and a peripheral connection plug 214 electrically connected to the peripheral contact plug 185. The connection plugs 211, 212, 213, and 214 may include at least one of a metal material or a metal nitride.

The upper interconnections 220b, 220s and 220p may include a plurality of interconnections disposed on the upper insulating layers 201, 202, 203 and 204. The upper interconnections 220b, 220s, and 220p may include a bitline 220b electrically connected to the first bitline connecting plug 211 and the second bitline connecting plug 212, a source interconnection 220s electrically connected to the source connection plug 213, and a peripheral interconnection 220p electrically connected to the peripheral connection plug 214. The upper interconnections 220b, 220s, and 220p may include a metal material, for example, at least one of tungsten (W), titanium (Ti), copper (Cu), or aluminum (Al).

FIGS. 5A to 5E are partially enlarged views of regions of a semiconductor device according to some example embodiments.

Figure 5A:
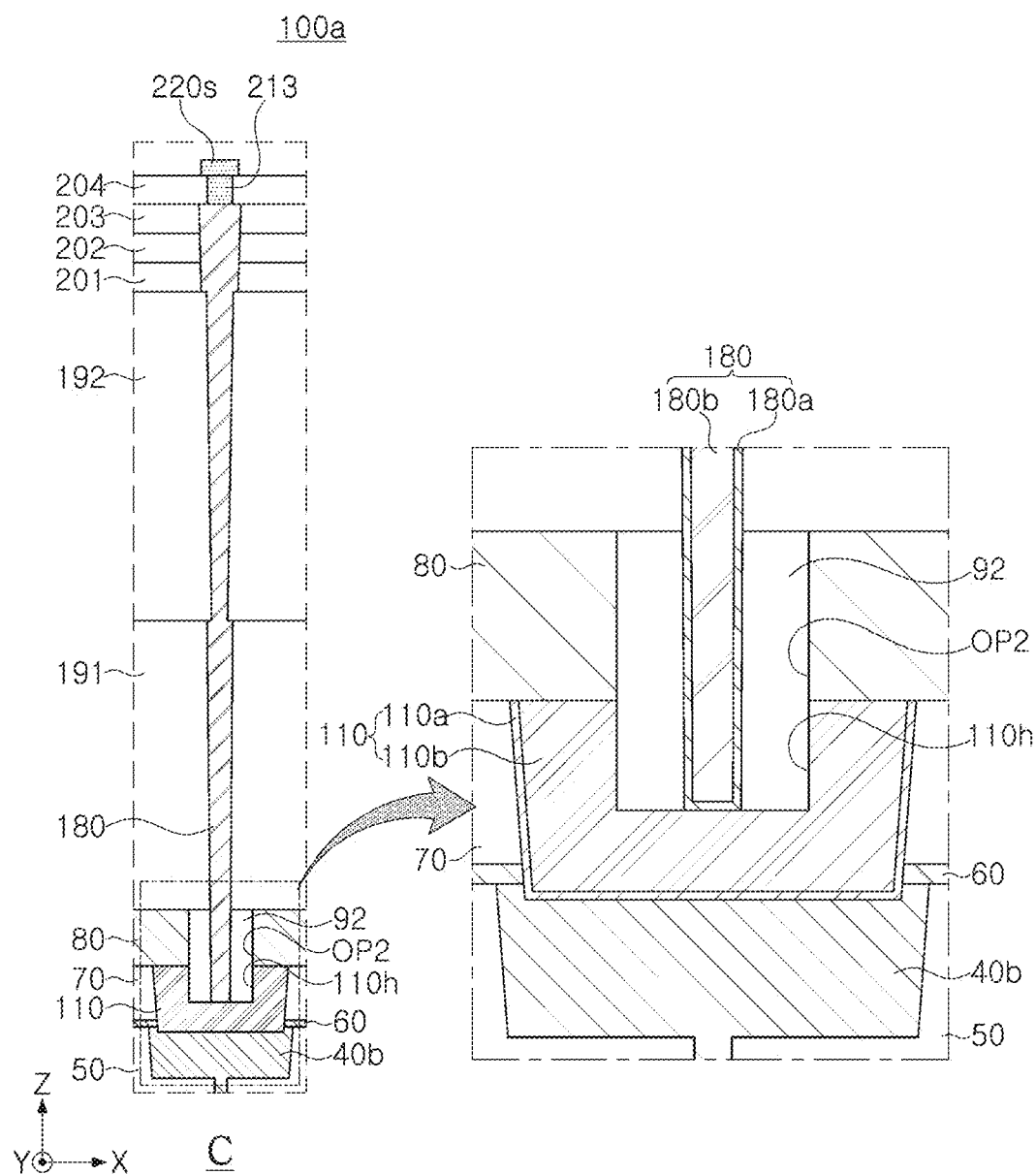
FIGS. 5A to 5E are partially enlarged views of regions of a semiconductor device according to some example embodiments.

Referring to FIG. 5A, in a semiconductor device 100a, a source connection pattern 110 may have a first upper surface in contact with a portion of a lower surface of the pattern structure 80 and a second surface exposed by a lower end portion of the hole 110h of the source connection pattern 110 and disposed on a lower level than the first upper surface. The source contact plug 180 may be in contact with the second upper surface of the source connection pattern 110. However, example embodiments are not limited thereto, and the source contact plug 180 may be disposed to recess a portion of the source connection pattern 110. A metal-semiconductor compound layer may be further disposed between the second conductive liner 180a of the source contact plug 180 and the source connection pattern 110.

Figure 5B:
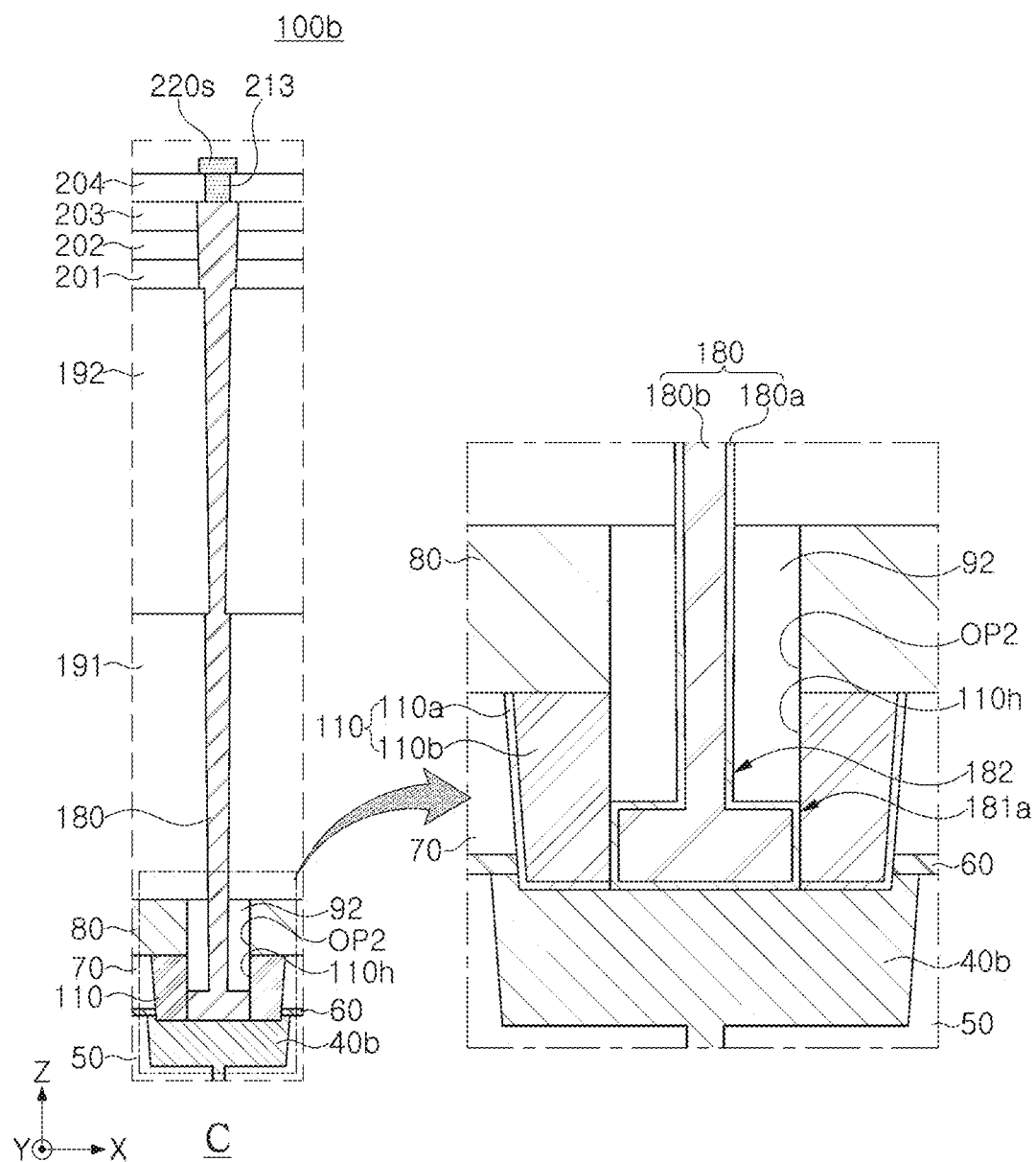

Referring to FIG. 5B, in a semiconductor device 100b, a source contact plug 180 may be connected to the second pad layer 40b through the conductive liner 110a of the source connection pattern 110. For example, the first plug portion 181a of the source contact plug 180 may be in direct contact with the second pad layer 40b through the conductive liner 110a of the source connection pattern 110. In some example embodiments, when the second conductive liner 180a of the source contact plug 180 is omitted, the second conductive plug 180b may be in direct contact with the second pad layer 40b, and a boundary therebetween may or may not be distinguished.

Figure 5C:
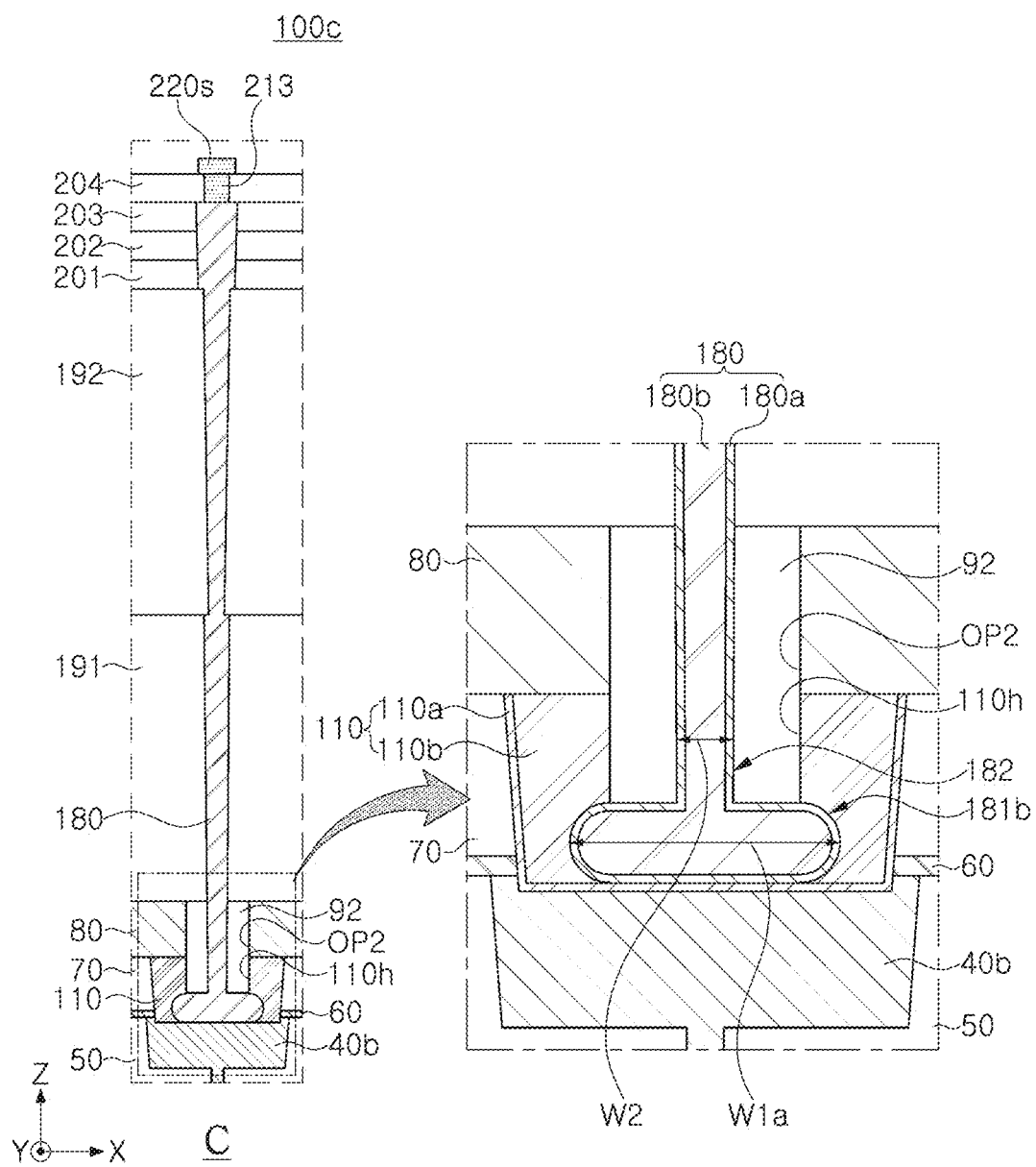

Referring to FIG. 5C, in a semiconductor device 100c, a first width W1a of a first plug portion 181b of a source contact plug 180 may be greater than a second width W2 of a second plug portion 182, and a side surface of the first plug portion 181b may protrude convexly toward the source connection pattern 110. A side profile of the first plug portion 181b may be determined depending on the extent of removing a semiconductor material layer of the source connection pattern 110 through a contact hole of the source contact plug 180. A shape of a first plug portion of the source contact plug 180 may vary according to example embodiments.

Figure 5D:
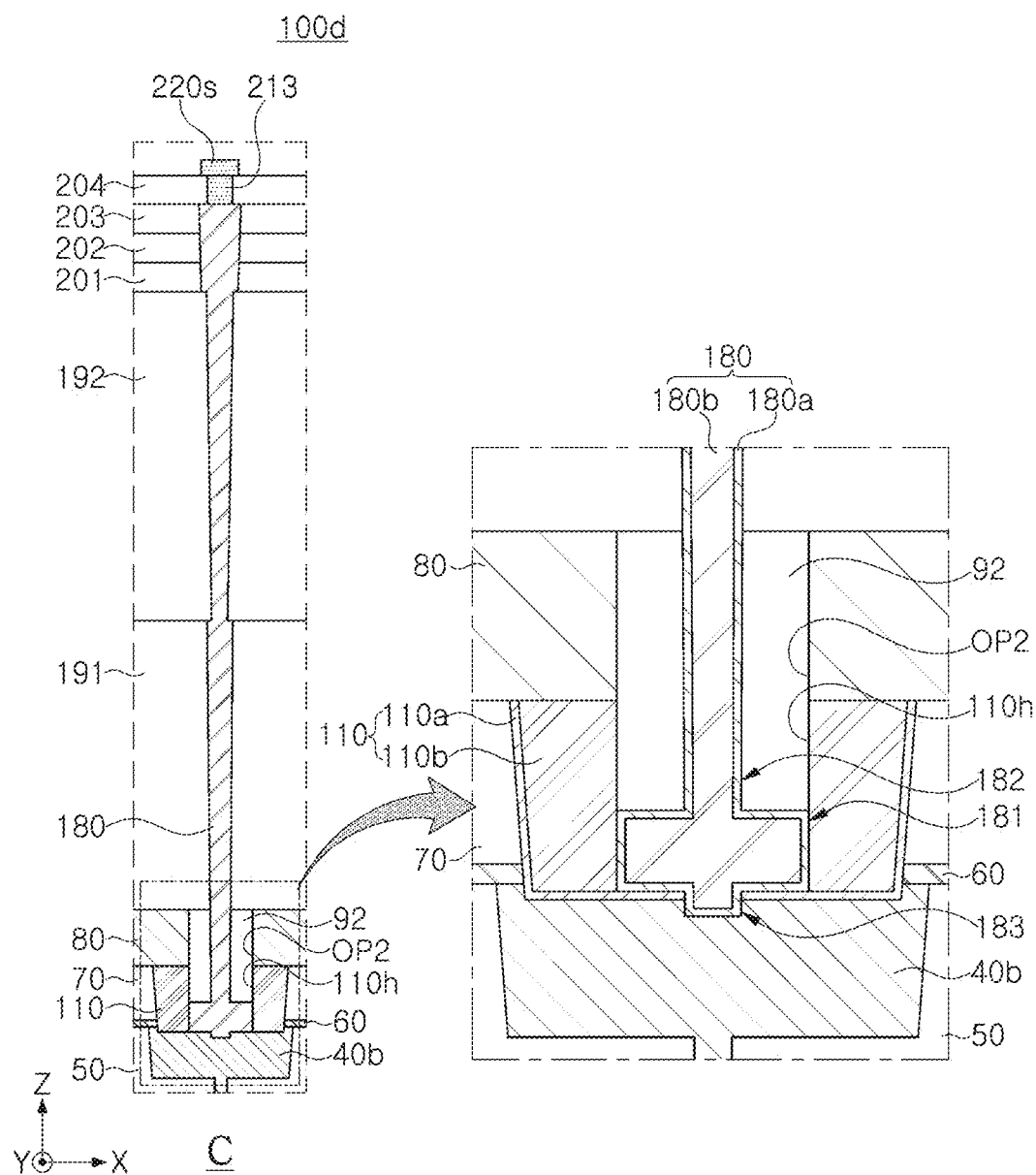

Referring to FIG. 5D, in a semiconductor device 100d, a source contact plug 180 may further include a third plug portion 183 protruding downwardly from the first plug portion 181. The third plug portion 183 may be in direct contact with the second pad layer 40b through the second conductive liner 110a of the source connection pattern 110. A width of the third plug portion 183 may be smaller than a width of the first plug portion 181.

Figure 5E:
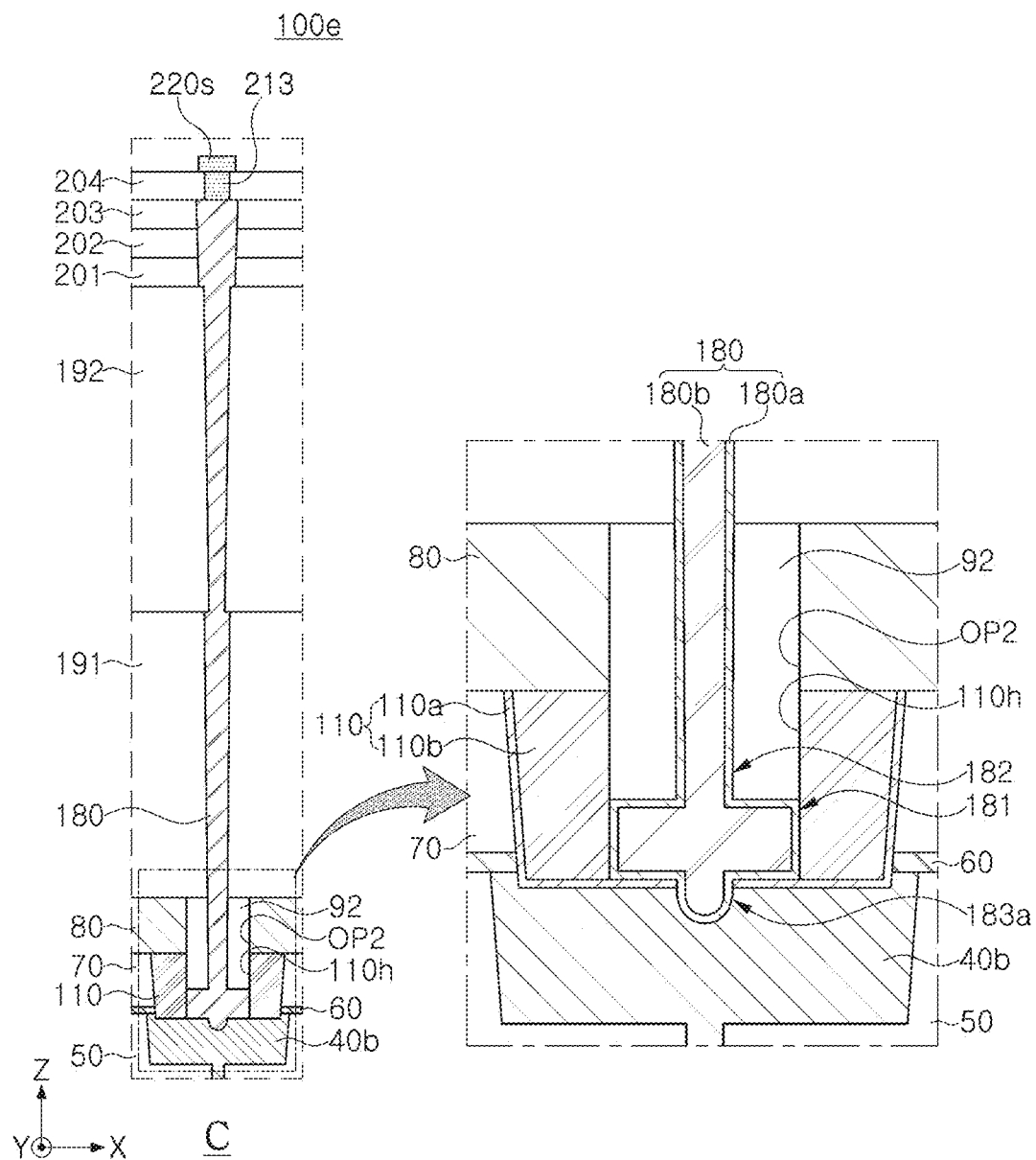

Referring to FIG. 5E, in a semiconductor device 100e, a third plug portion 183a of a source contact plug 180 may protrude downwardly from a first plug portion 181, and a lower surface of the third plug portion 183a may have a convex shape.

Figure 6:
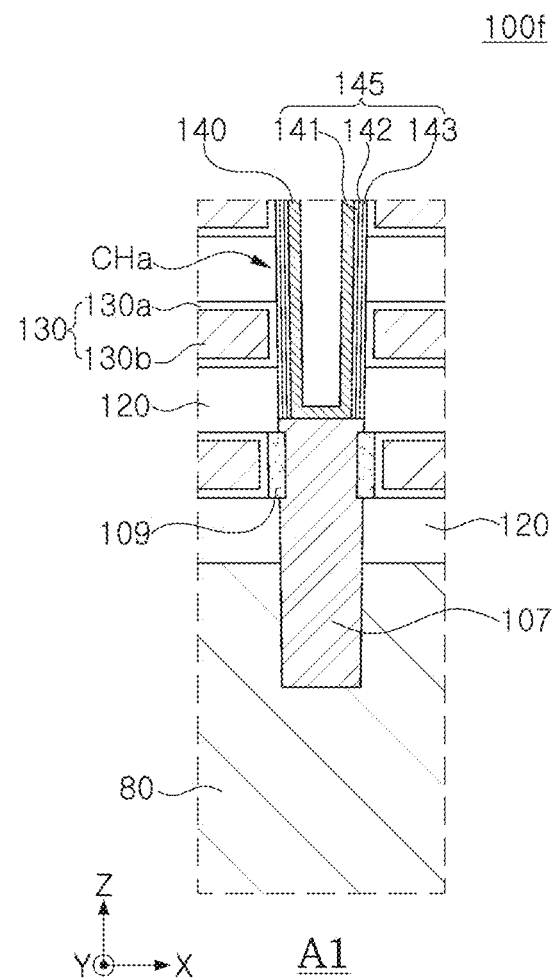
FIG. 6 is a partially enlarged view of a region of a semiconductor device according to some example embodiments.

FIG. 6 is a partially enlarged view of a region of a semiconductor device according to some example embodiments. FIG. 6 illustrates a region corresponding to a region represented by "A1" of FIG. 4A.

Referring to FIG. 6, in a semiconductor device 100f, a pattern structure 80 of a second structure 2 may not include a first pattern 81, a second pattern 82, and sacrificial insulating patterns 84, 85, and 86. In addition, a channel structure CHa may further include an epitaxial layer 107.

The epitaxial layer 107 may be in contact with the pattern structure 80 on a lower end of the channel structure CHa, and may be adjacent to a side surface of the at least one gate electrode 130. The epitaxial layer 107 may be disposed in a recessed region of the pattern structure 80. A height level of an upper surface of the epitaxial layer 107 may be higher than a height level of an upper surface of a lowermost gate electrode 130 and lower than a height level of a lower surface of the upper gate electrode 130, but example embodiments are not limited thereto. The epitaxial layer 107 may be connected to the channel layer 140 through the upper surface thereof. A gate insulating layer 109 may be further disposed between the epitaxial layer 107 and a lowermost gate electrode 130 adjacent to the epitaxial layer 107.

Figure 7:
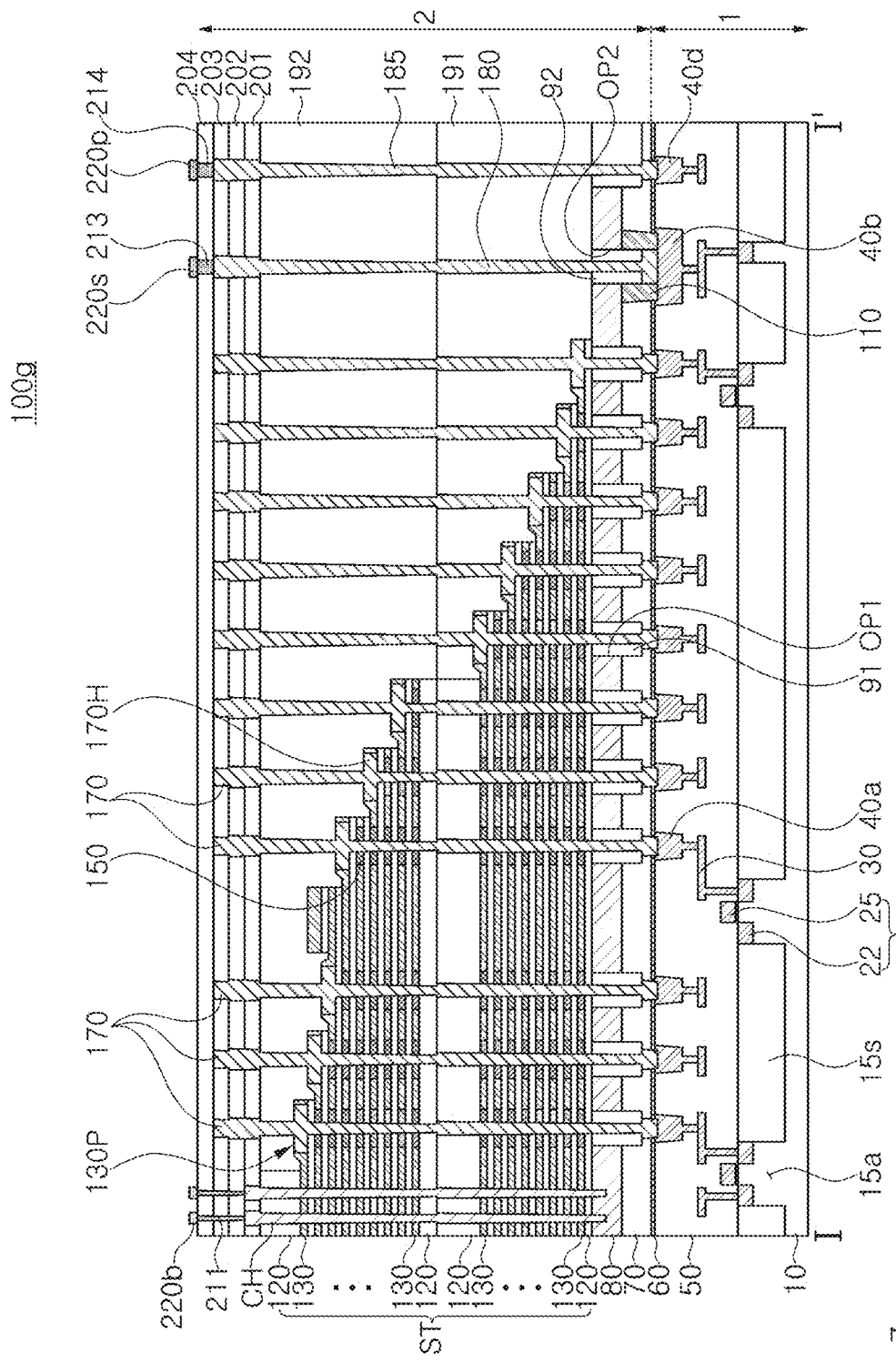
FIG. 7 is a schematic cross-sectional view of a semiconductor device according to some example embodiments.

FIG. 7 is a schematic cross-sectional view of a semiconductor device according to some example embodiments. FIG. 7 illustrates a region corresponding to FIG. 3A.

Referring to FIG. 7, in a semiconductor device 100g, a second pad layer 40b connected to a source contact plug 180 may be electrically connected to an impurity region of a substrate 10 through circuit interconnections 30. The impurity region may be a ground region. The impurity region may be, for example, a source/drain region 22 of an individual device constituting a circuit device 20. Unlike that illustrated in the drawing, the second pad layer 40b may be directly connected to the substrate 10 through a single contact via without going through the circuit interconnections 30.

FIGS. 8A to 17B are schematic cross-sectional views illustrating a method of fabricating a semiconductor device according to some example embodiments.

Figure 8A:
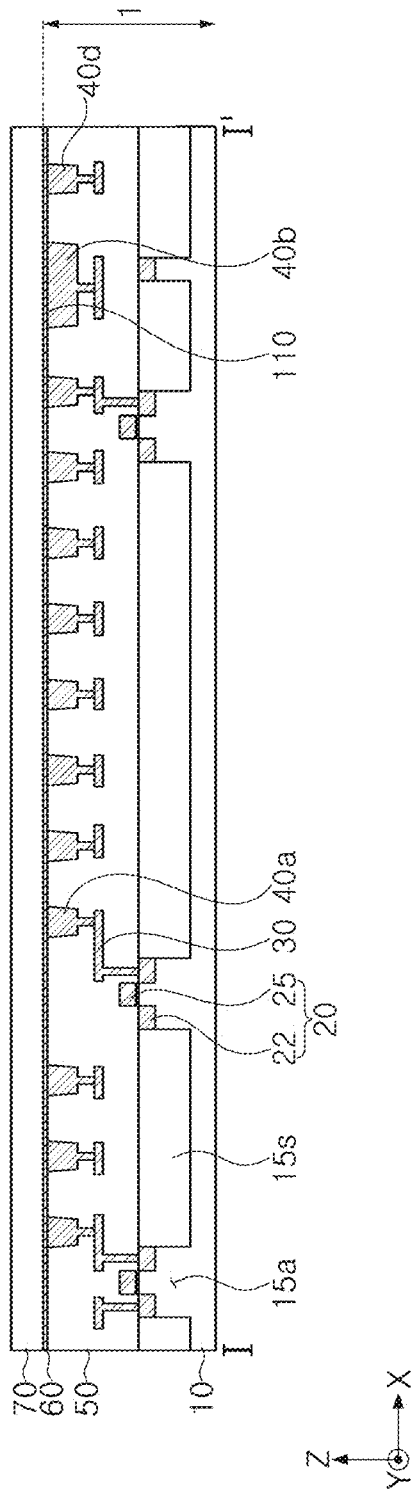
FIGS. 8A to 17B are schematic cross-sectional views illustrating a method of fabricating a semiconductor device according to some example embodiments.

Referring to FIG. 8A, a first structure 1 including circuit devices 20, circuit interconnections 30, and pad layers 40a, 40b, and 40d may be formed on a substrate 10. A lower insulating layer 70 may be formed on the first structure 1.

Device isolation layers 15s may be formed in the substrate 10, and a circuit gate electrode 25 and source/drain regions 22 may be formed on the active region 15a on the substrate 10. The device isolation layers 15s may be formed by, for example, a shallow trench isolation (STI) process. A dielectric layer, including an insulating material such as silicon oxide, may be formed between the active region 15a and the circuit gate electrode 25. The circuit gate electrode 25 may be formed of at least one of polycrystalline silicon or a metal-semiconductor compound, but example embodiments are not limited thereto. Although not illustrated in the drawing, spacer layers may be formed on opposite sidewalls of the circuit gate electrode 25.

The circuit interconnections 30 and the pad layers 40a, 40b, and 40d may be formed by forming a portion of a lower capping insulating layer 50, etching the portion to be removed, and filling the removed portion with a conductive material. In some example embodiments, the circuit interconnections 30 and the pad layers 40a, 40b, and 40d may be formed by depositing a conductive material, patterning the conductive material, and filling a region, removed by the patterning, with a portion of the lower capping insulating layer 50. Among the pad layers 40a, 40b, and 40d, the second pad layer 40b may be formed to have a width greater than a width of the first pad layer 40a.

The pad layers 40a, 40b, and 40d and the lower capping insulating layer 50 may be formed, and an etch-stop layer 60 may be formed to cover upper surfaces of the pad layers 40a, 40b, 40d and the lower capping insulating layer 50. A lower insulating layer 70 may be formed on the etch-stop layer 60. Referring to FIG. 9B to be described later, in the present operation, a third pad layer 40c may also be formed.

Figure 8B:
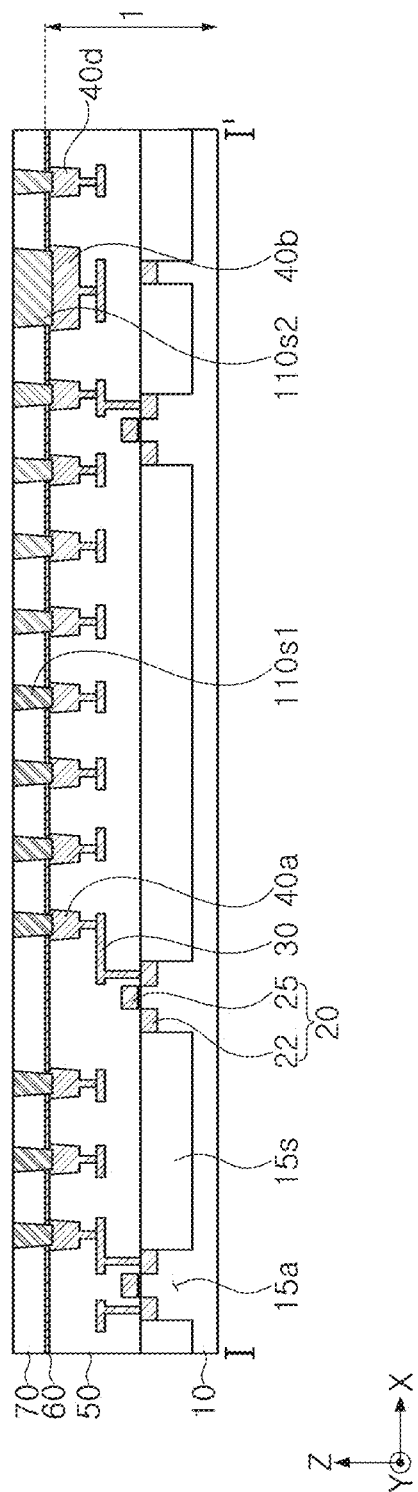

Referring to FIG. 8B, vias 110s1 and 110s2 may be formed to penetrate through the lower insulating layer 70.

The vias 110s1 and 110s2 may be formed by forming via holes to penetrate through a portion of the lower insulating layer 70 and filling the vias with a conductive material. The forming of the vias 110s1 and 110s2 may include forming a conductive liner along the via holes and upper surfaces of the lower insulating layer 70, forming a semiconductor material layer to extend upwardly from the lower insulating layer 70 while covering the conductive liner and filling the via holes, and performing a planarization process. The conductive liner may be formed of at least one of, for example, titanium (Ti), titanium nitride (TiN), tantalum (Ta), or tantalum nitride (TaN). The semiconductor material layer may be a silicon layer. The conductive liner and the semiconductor material layer may be removed by performing a planarization process until an upper surface of the lower insulating layer 70 is exposed. The vias 110s1 and 110s2 may be in contact with the pad layers 40a, 40b, 40c, and 40d through the etch-stop layer 60.

Figure 8C:
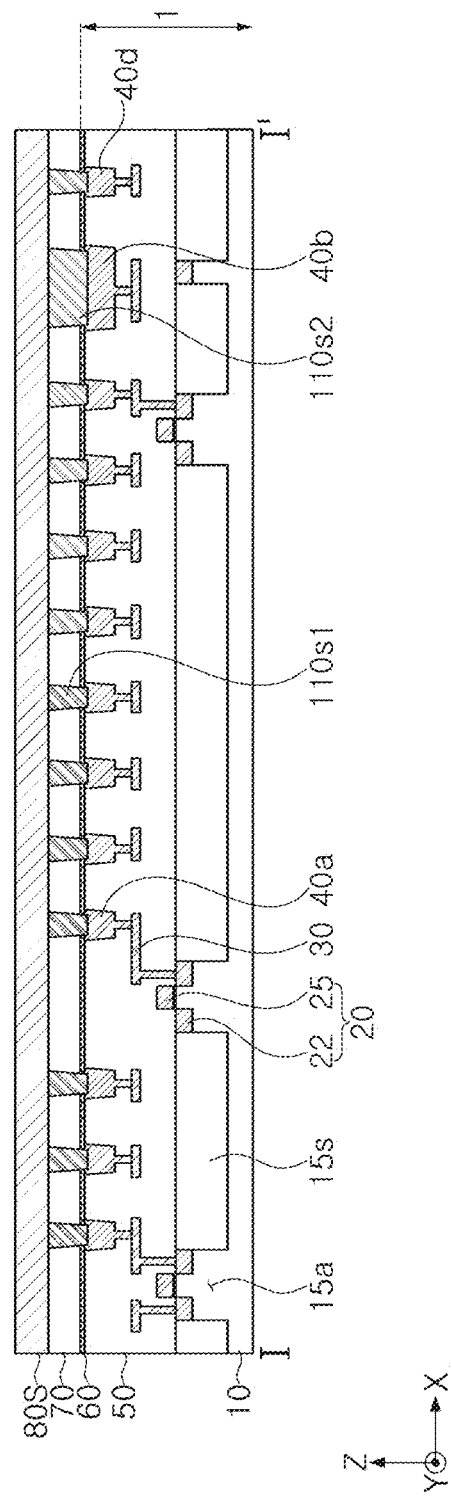

Referring to FIG. 8C, a pattern layer 80S may be formed on the vias 110s1 and 110s2.

The pattern layer 80S may be formed to cover the vias 110s1 and 110s2 and the lower insulating layer 70. In some example embodiments, the pattern layer 80S may be formed as a single layer, for example, a silicon layer. In some example embodiments, the forming of the pattern layer 80S may include sequentially stacking a base pattern 80B, a sacrificial insulating patterns 84, 85, and 86, and a second pattern 82, as illustrated in FIG. 3B. In a region in which the sacrificial insulating patterns 84, 85, and 86 are removed, the second pattern 82 may be bent to be in contact with the base pattern 80B. A portion of the sacrificial insulating patterns 84, 85, and 86 may be replaced with the first pattern 81 of FIG. 4A, formed by a subsequent process, in a first region MCA.

Figure 8D:
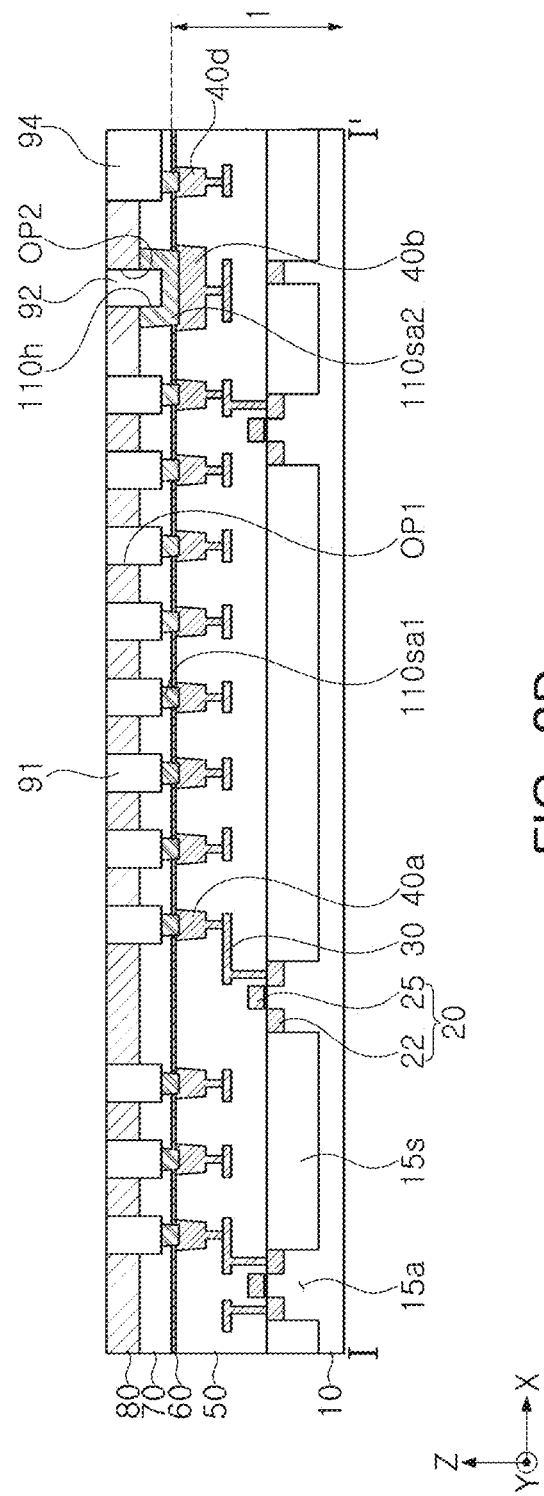

Referring to FIG. 8D, openings OP1 and OP2 may be formed to penetrate through the pattern layer 80S, and through-insulating layers 91 and 92 may be formed.

The pattern layer 80S may be patterned to form openings OP1 and OP2 penetrating through the pattern layer 80S. The openings OP1 and OP2 may be arranged as illustrated in FIG. 1B. Portions of the vias 110s1 and 110s2 and the lower insulating layer 70 may also be removed while forming the openings OP1 and OP2. The first opening OP1 may be formed to have a width greater than a width of the first via 110s1, whereas the second opening OP2 may be formed to a width smaller than a width of the second via 110s2. The second via 110s2 may be removed from an upper center portion thereof to a desired (or alternatively, predetermined) depth to form a hole 110h penetrating through a portion of an upper region of the second via 110s2. A side surface of the hole 110h of the second via 110s2 and a side surface of the second opening OP2 may be aligned with each other. The pattern layer 80S may be formed as a pattern structure 80 having the openings OP1 and OP2. Upper portions of the vias 110s1 and 110s2 may be removed to form via patterns 110sa1 and 110sa1. In a region in which the peripheral contact plug 185 of FIG. 3A is to be formed, an external insulating layer 94 may be formed to extend in a Y direction and to be in contact with an external surface of the pattern layer 80S. Referring to FIG. 9B to be described later, in the present operation, a third opening OP3 may be formed to penetrate through the pattern layer 80S, and a third through-insulating layer 93 may also be formed.

Figure 9A:
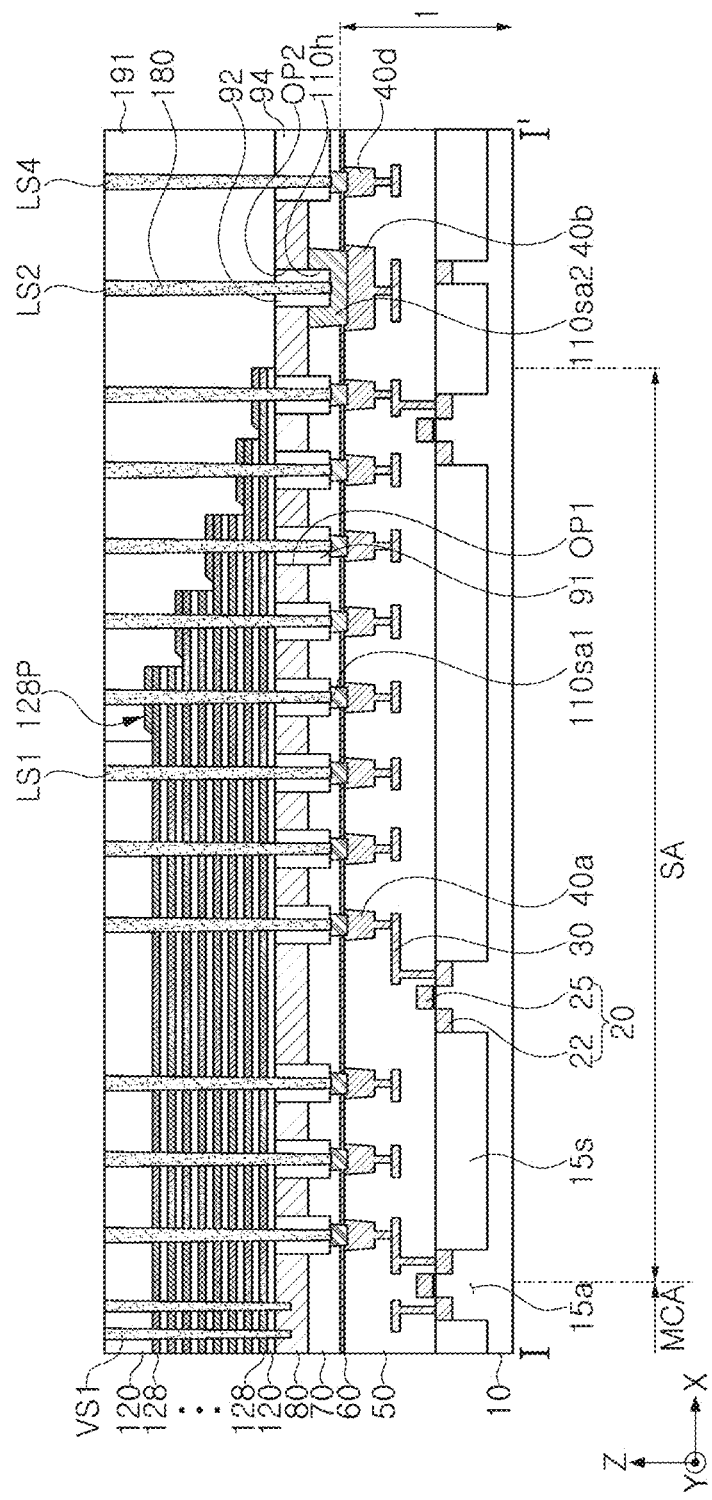
Figure 9B:
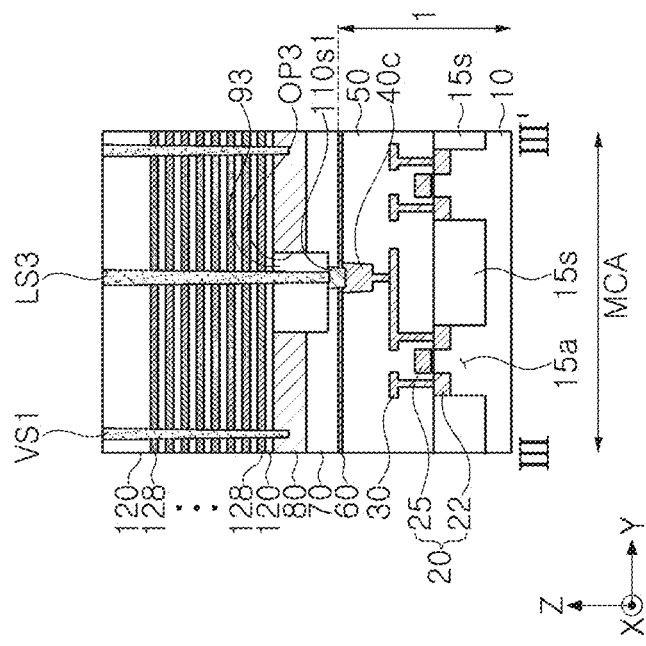
Figure 9B:
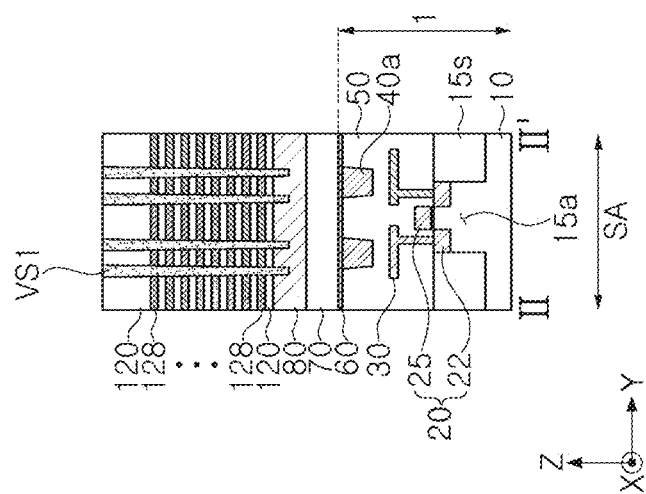

Referring to FIGS. 9A and 9B, interlayer insulating layers 120 and sacrificial insulating layers 128 may be alternately stacked to form a lower mold structure, and lower vertical structures may be formed to penetrate through the lower mold structure.

The sacrificial insulating layers 128 may be a layer having a portion to be replaced with gate electrodes 130 (see FIG. 3A) by a subsequent process. The sacrificial insulating layers 128 may be formed of a material different from a material of the interlayer insulating layers 120, and may be formed of a material etched with etch selectivity with respect to the interlayer insulating layers 120 under specific etching conditions. Each of the sacrificial insulating layers 128 and the interlayer insulating layers 120 may be formed of at least one of silicon, silicon oxide, or silicon nitride. For example, the interlayer insulating layers 120 may be formed of silicon oxide, and the sacrificial insulating layers 128 may be formed of silicon nitride.

A photolithography process and an etching process may be repeatedly performed on the sacrificial insulating layers 128 using a mask layer such that overlying sacrificial insulating layers 128 extend by a distance shorter than the lower sacrificial insulating layers 128 in a second region SA. Accordingly, the sacrificial insulating layers 128 may form a staircase-shaped step structure in a desired (or alternatively, predetermined) unit in the second region SA. Sacrificial insulating layers may be further formed on the sacrificial insulating layers 128, which constitute the step structure, to form sacrificial pad regions 128P. A first capping insulating layer 191 may be formed to cover the pad regions 128P and the pattern structure 80.

Lower vertical structures may be formed by forming lower holes to penetrate through the lower mold structure in a Z direction and filling the lower holes with a sacrificial material. In the lower vertical structures, a lower end of a lower sacrificial channel layer VS1 may be disposed in the pattern structure 80. In the lower vertical structures, lower sacrificial plugs LS1, LS2, LS3, and LS4 may extend downwardly further than the pattern structure 80 through the through-insulating layers 91, 92, and 93 and the external insulating layer 94, respectively. The lower sacrificial plugs LS1, LS2, LS3, and LS4 may be in contact with via patterns 110sa1 and 110sa2.

In the present operation, when the second lower sacrificial plug LS2 is formed to recess a portion of the second pad layer 40b through a second via pattern 110s2, the semiconductor device of FIGS. 5D and 5E may be provided through process operations to be described later.

Figure 10A:
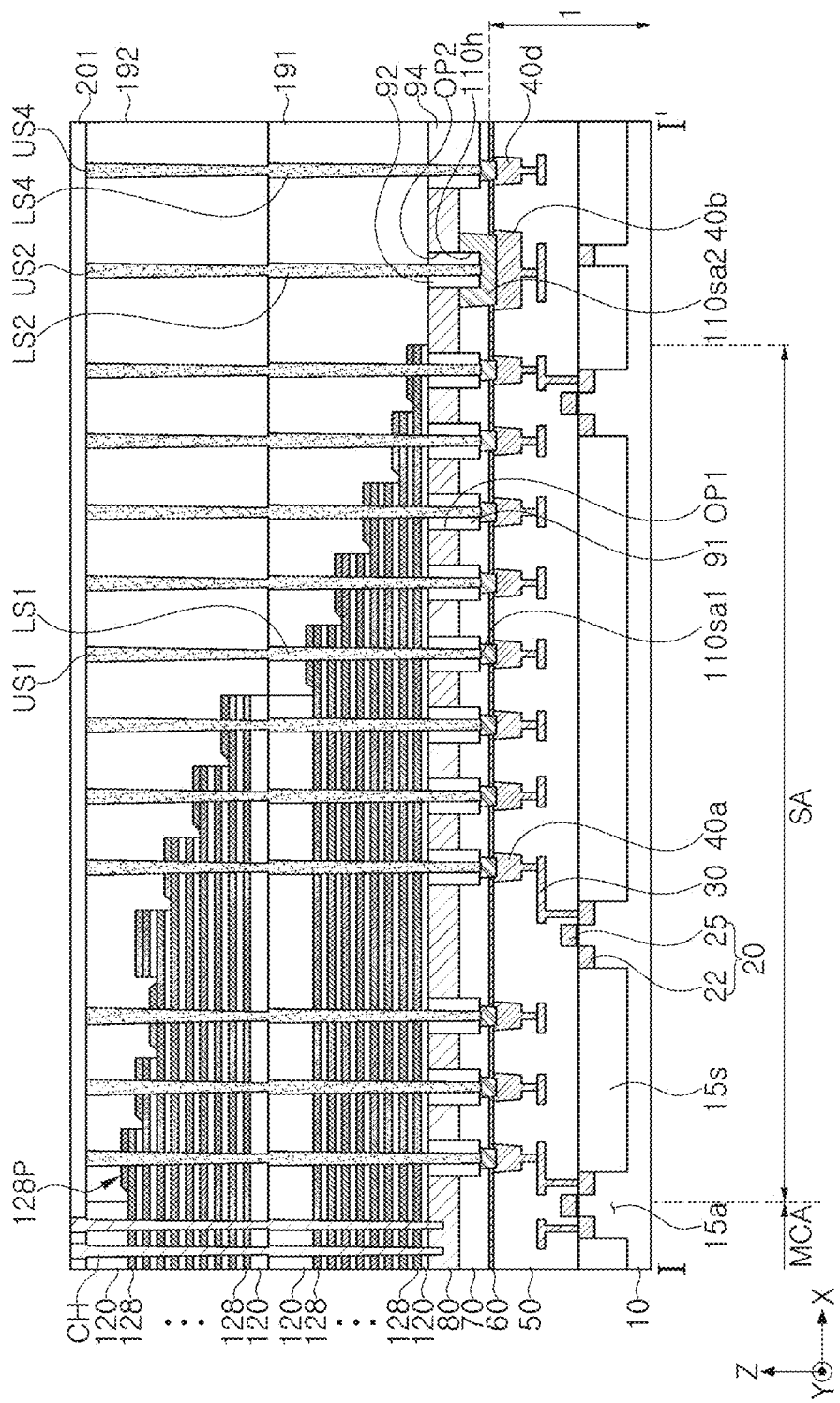
Figure 10B:
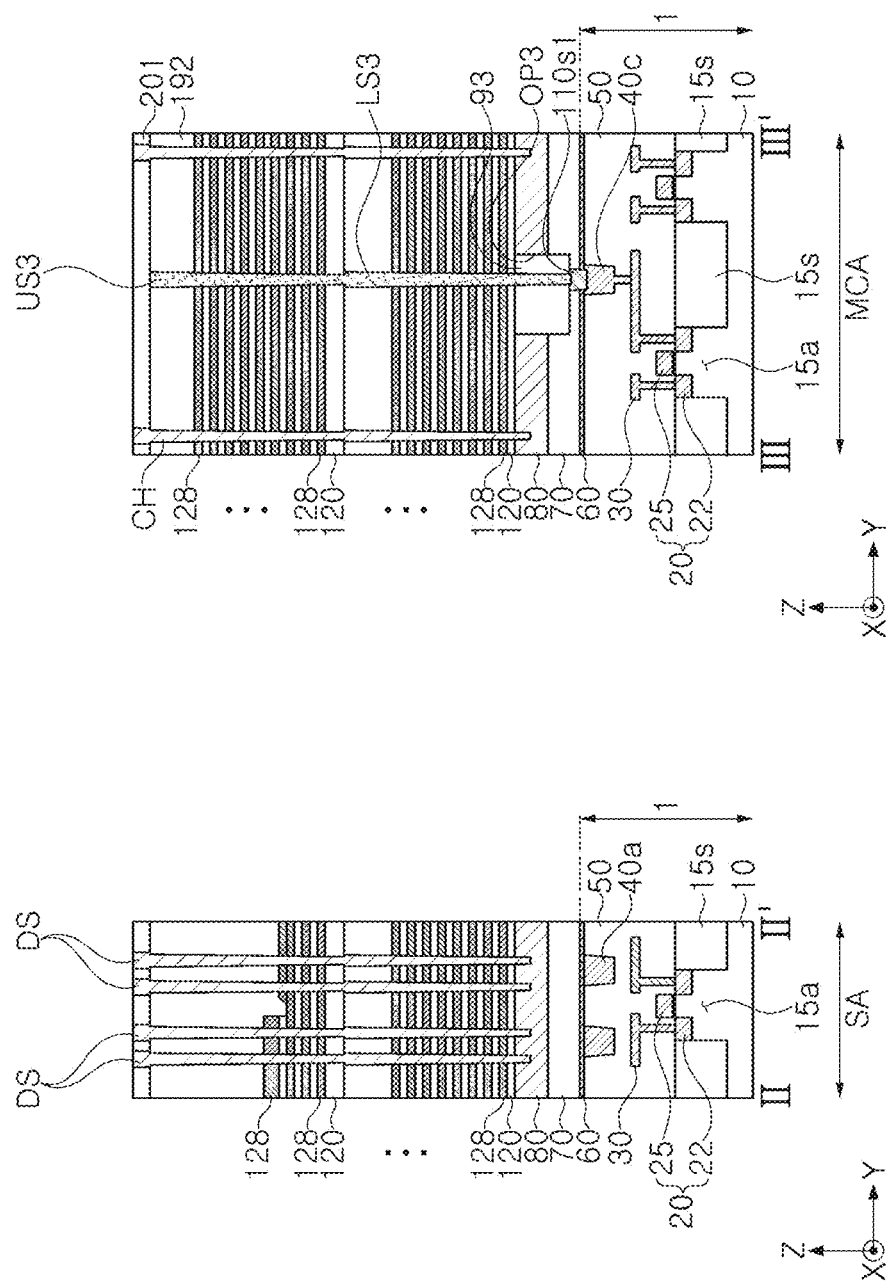

Referring to FIGS. 10A and 10B, interlayer insulating layers 120 and sacrificial insulating layers 128 may be alternately stacked on the lower mold structure to form an upper mold structure, upper vertical structures may be formed to penetrate through the upper mold structure, and a channel structure CH and a dummy vertical structure DS may be formed.

As described above, the sacrificial insulating layers 128 and the interlayer insulating layers 120 may be alternately and repeatedly laminated on the lower mold structure. Similar to the lower mold structure, in the upper mold structure, the sacrificial insulating layers 128 may constitute a staircase-shaped step structure in a desired (or alternatively, predetermined) unit on the second region SA, and the sacrificial pad regions 128P may be formed. A second capping insulating layer 192 may be formed to cover the first capping insulating layer 191 and the sacrificial pad regions 128P.

The upper vertical structures may be formed by forming upper holes to penetrate through the upper mold structure in the Z direction and filling the upper holes with a sacrificial material. In the upper vertical structures, upper sacrificial plugs US1, US2, US3, and US4 may be formed to be in contact with lower sacrificial plugs LS1, LS2, LS3 and LS4, respectively. In the upper vertical structures, an upper sacrificial channel layer may be formed to be in contact with a lower sacrificial channel layer VS1.

The channel hole may be formed by forming a first upper insulating layer 201 and exposing a portion of the first upper insulating layer 201 on the upper sacrificial channel layer to remove the upper sacrificial channel layer and the lower sacrificial channel layer VS1. A plurality of layers may be formed in the channel hole to form the channel structure CH of FIG. 4A in the first region MCA and to form the dummy vertical structure DS of FIG. 3B in the second region SA.

Figure 11A:
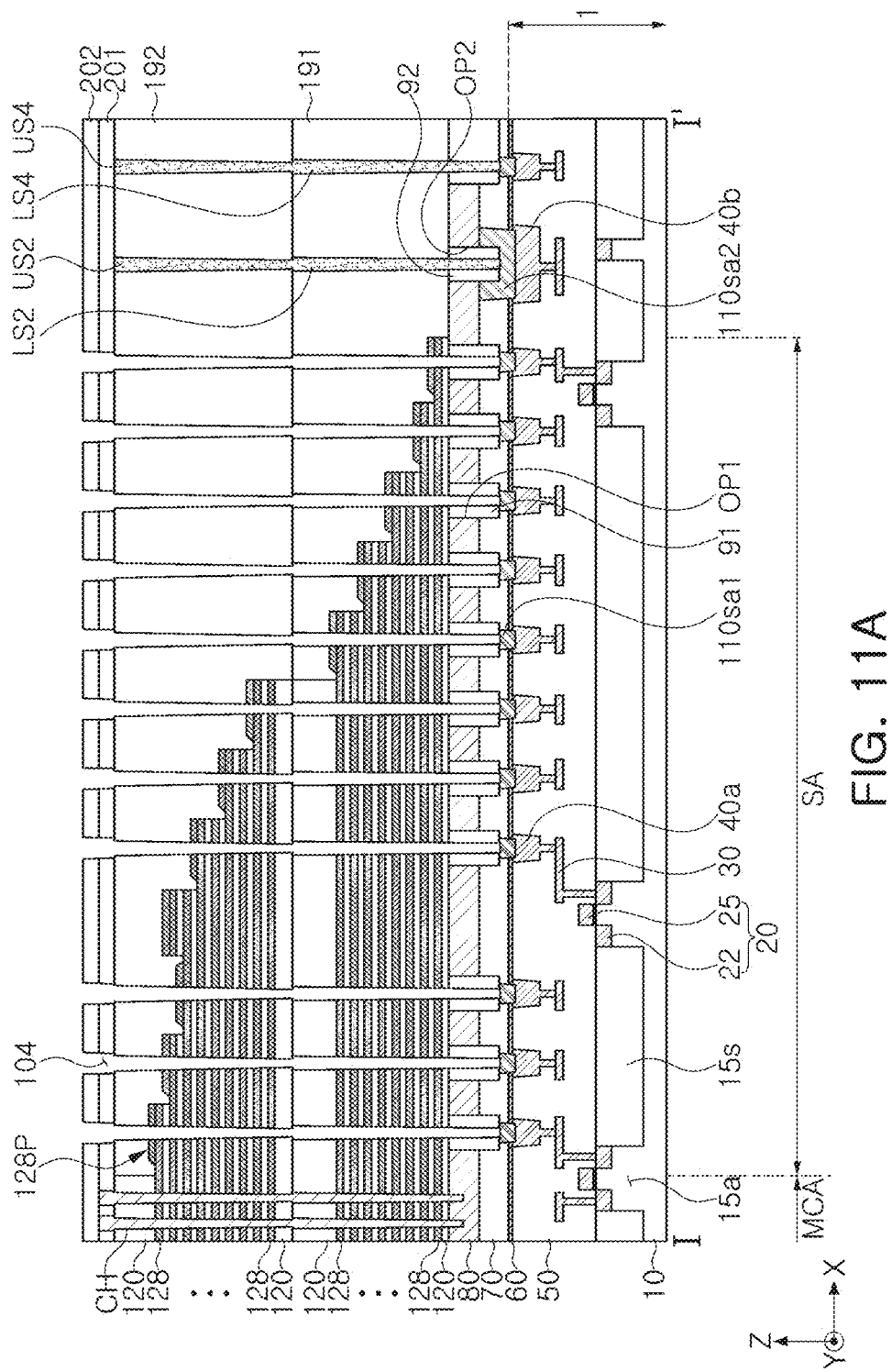
Figure 11B:
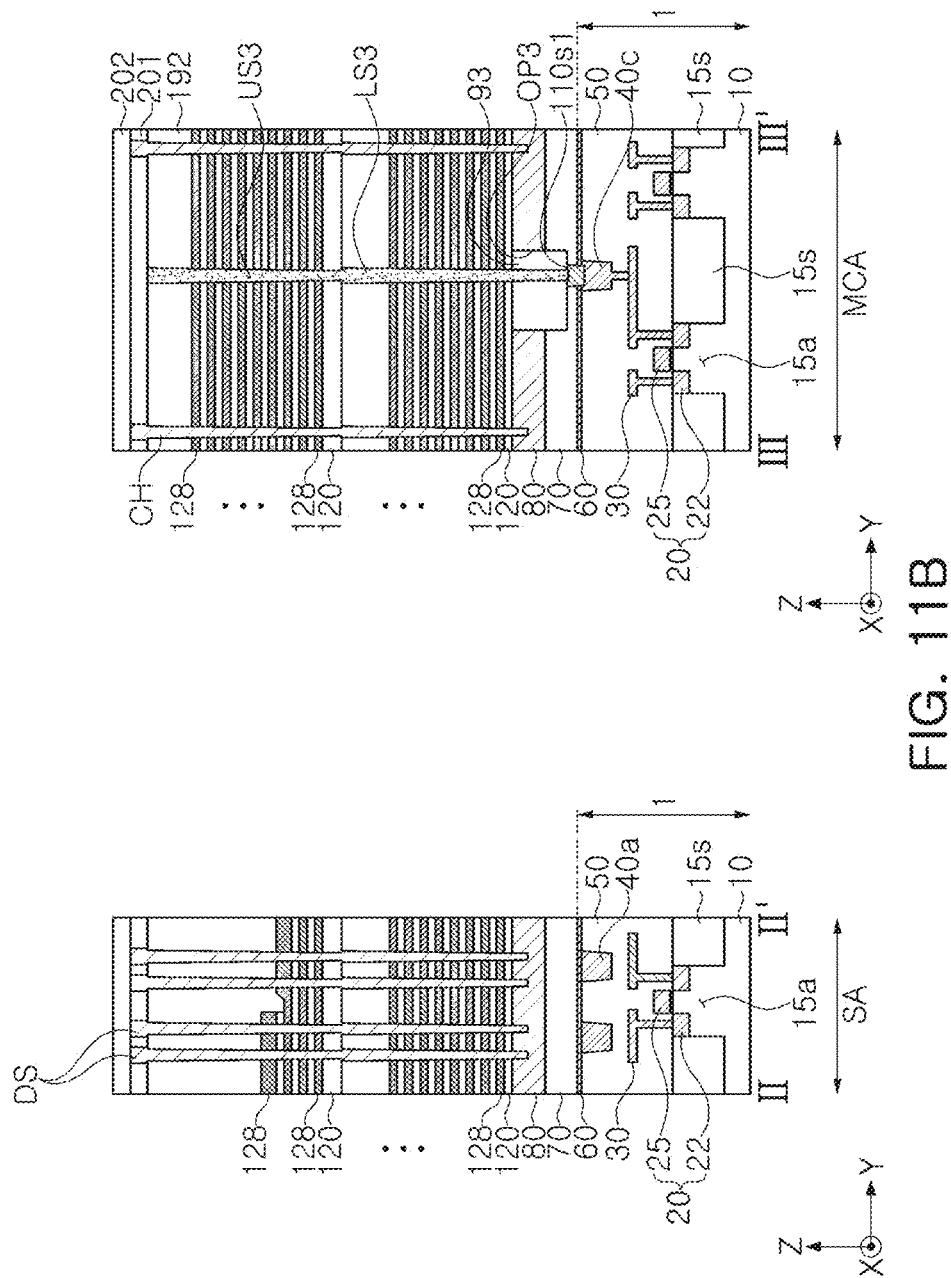

Referring to FIGS. 11A and 11B, the first lower sacrificial plugs LS1 and the first upper sacrificial plugs US1 may be removed to form first contact holes 104.

The first upper sacrificial plugs US1 and the first lower sacrificial plugs LS1 may be removed by forming a second upper insulating layer 202 on the first upper insulating layer 201 and exposing a portion of the first and second upper insulating layers 201 and 202 on the first upper sacrificial plugs US1. As the first lower sacrificial plugs LS1 are removed, the first via patterns 110sa1 may be exposed on a lower end of the first contact hole 104.

Figure 12A:
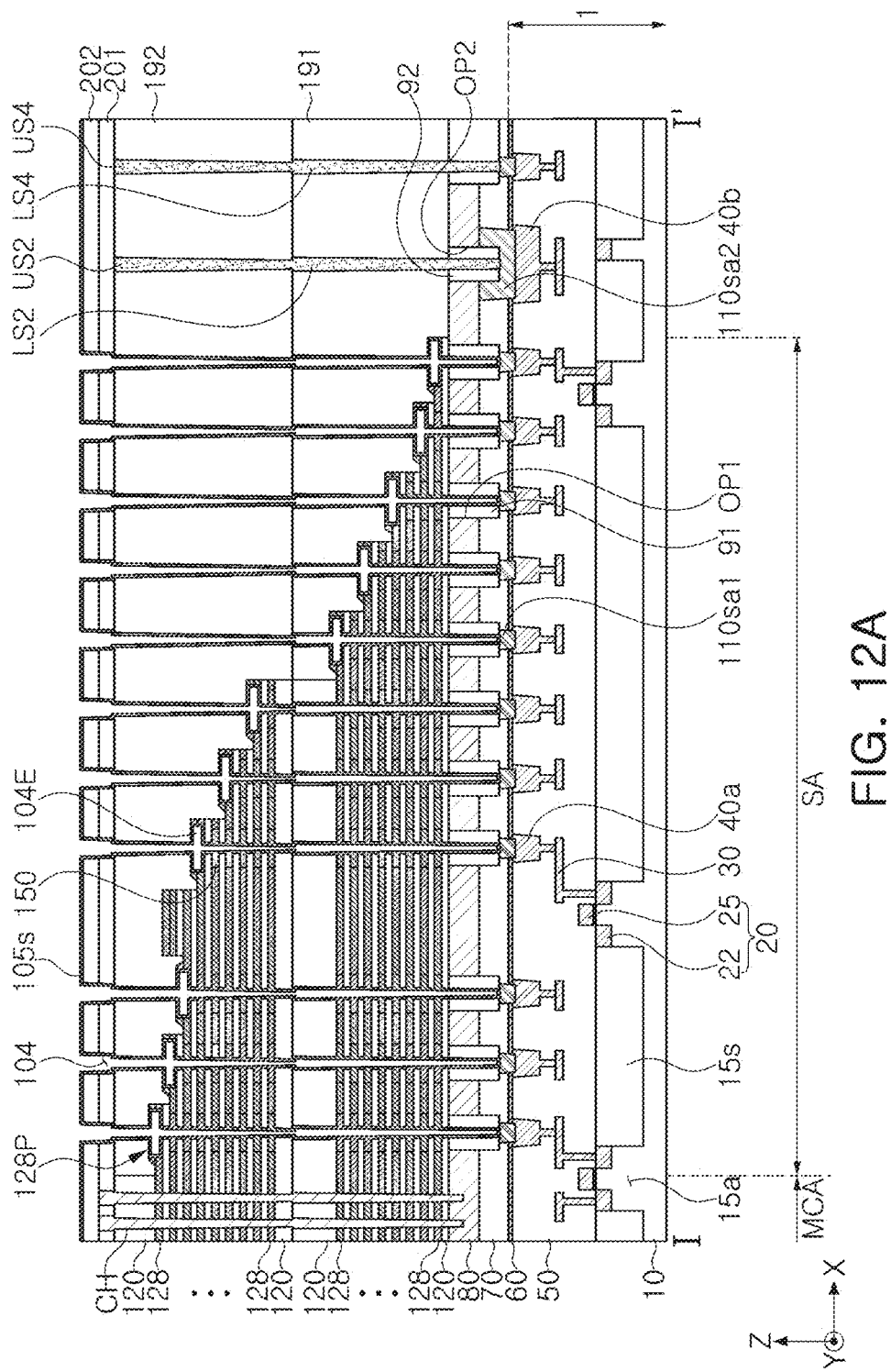
Figure 12B:
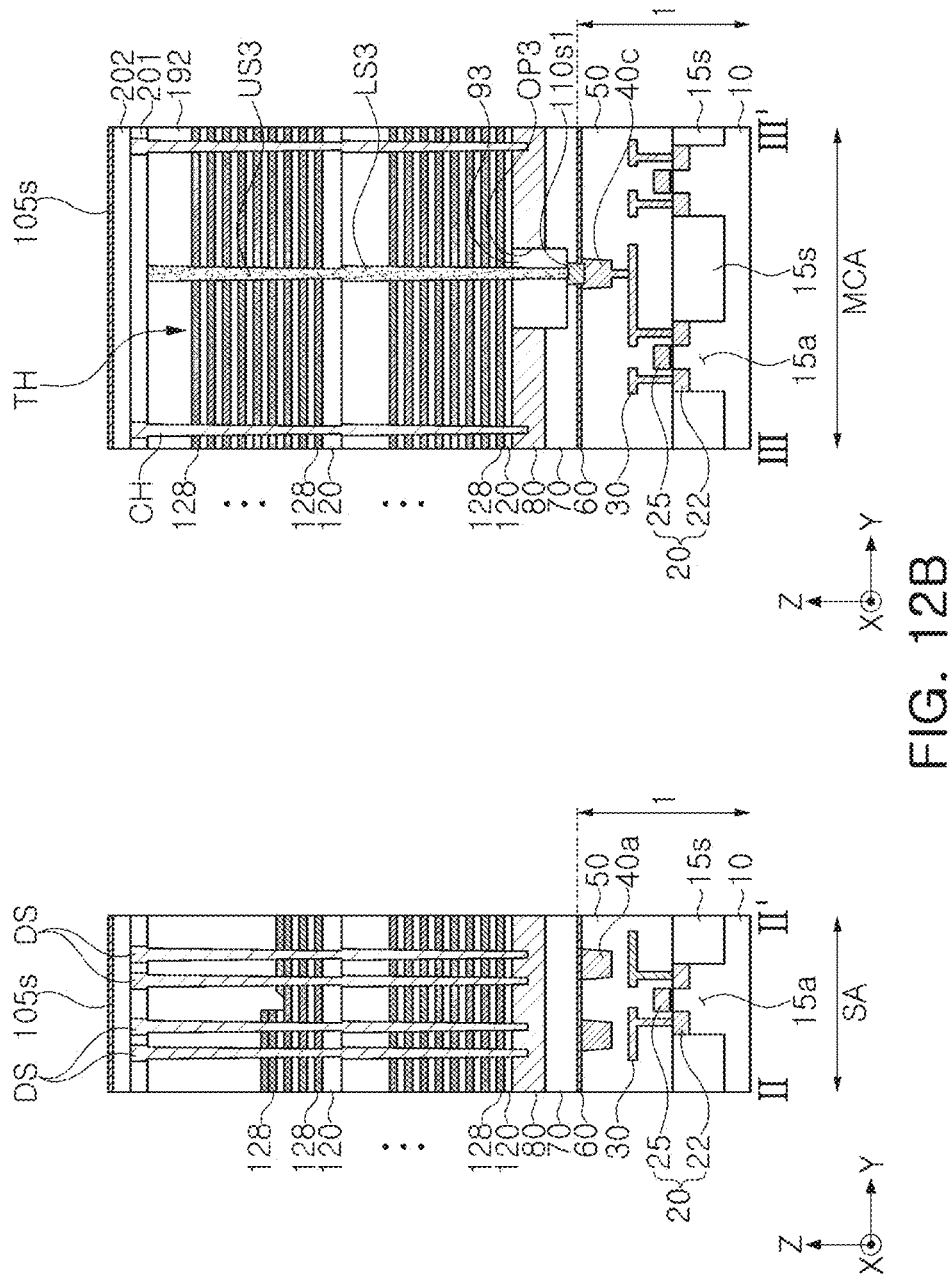

Referring to FIGS. 12A and 12B, the sacrificial insulating layers 128 and the sacrificial pad regions 128P exposed by the first contact holes 104 may be partially etched to form extension holes extending from the first contact holes 104, and a buffer insulating layer 105s may be formed in the first contact holes 104 and the extension holes.

Among the extension holes, pad extension holes 104E formed in the sacrificial pad regions 128P may have a greater thickness than other extension holes formed by removing the other sacrificial insulating layers 128 therebelow. The buffer insulating layer 105s may cover sidewalls of the first contact holes 104, while filling the other extension holes, to be formed as a buffer insulating pattern 150. For example, the buffer insulating layer 105s, filling the other extension holes except for the pad extension holes 106E among the extension holes, may be defined as buffer insulating patterns 150. The buffer insulating layer 105s may conformally cover an internal wall of the pad extension hole 104E without filling the pad extension hole 104E. The buffer insulating layer 105s may cover an upper portion of the second upper insulating layer 202.

Figure 13:
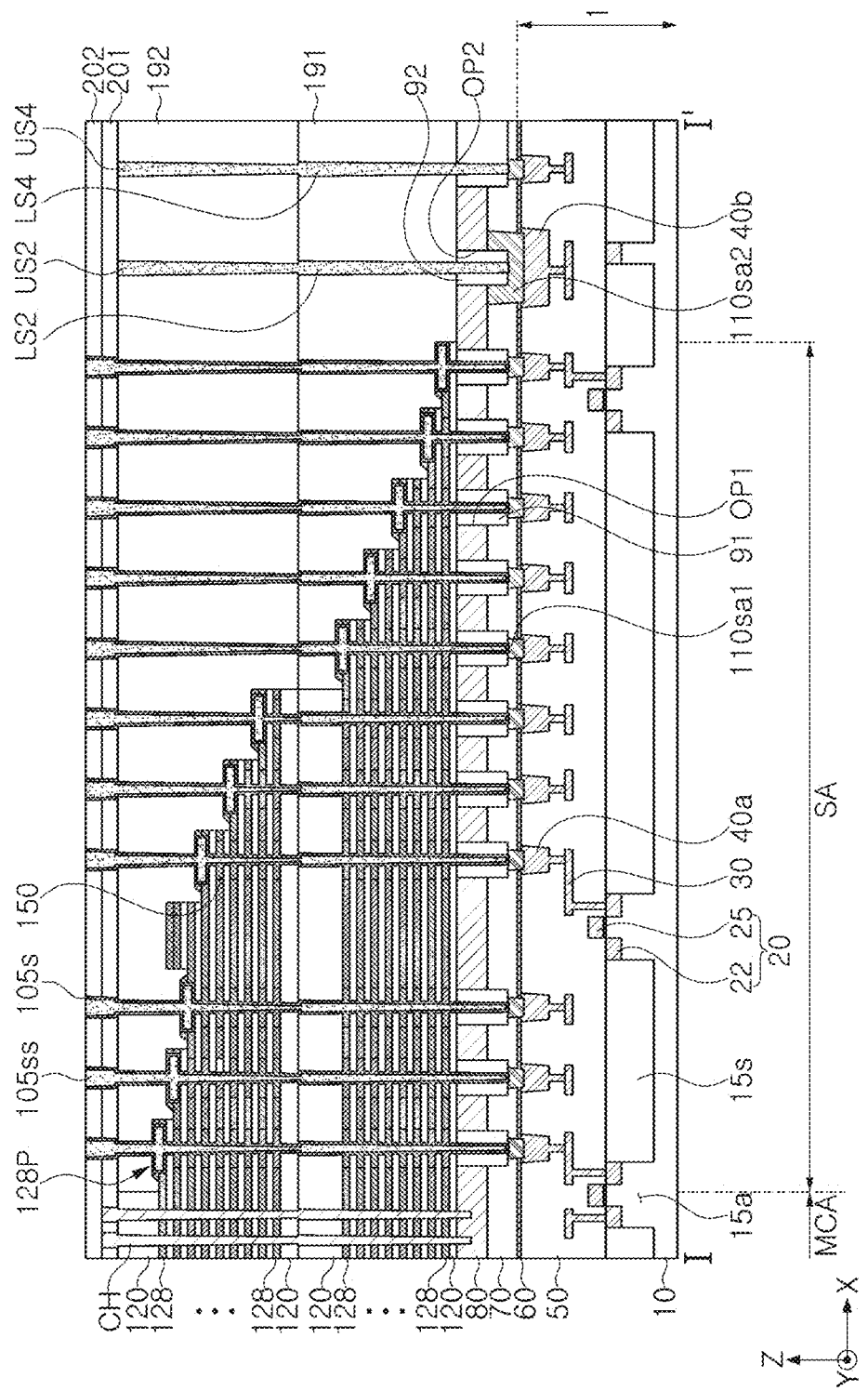

Referring to FIG. 13, sacrificial gate contact plugs 105ss may be formed on the buffer insulating layer 105s to fill the first contact holes 104 and the pad extension holes 104E. The sacrificial gate contact plugs 105ss may be formed of a semiconductor material such as silicon or an insulating material such as silicon oxide or silicon nitride.

Figure 14A:
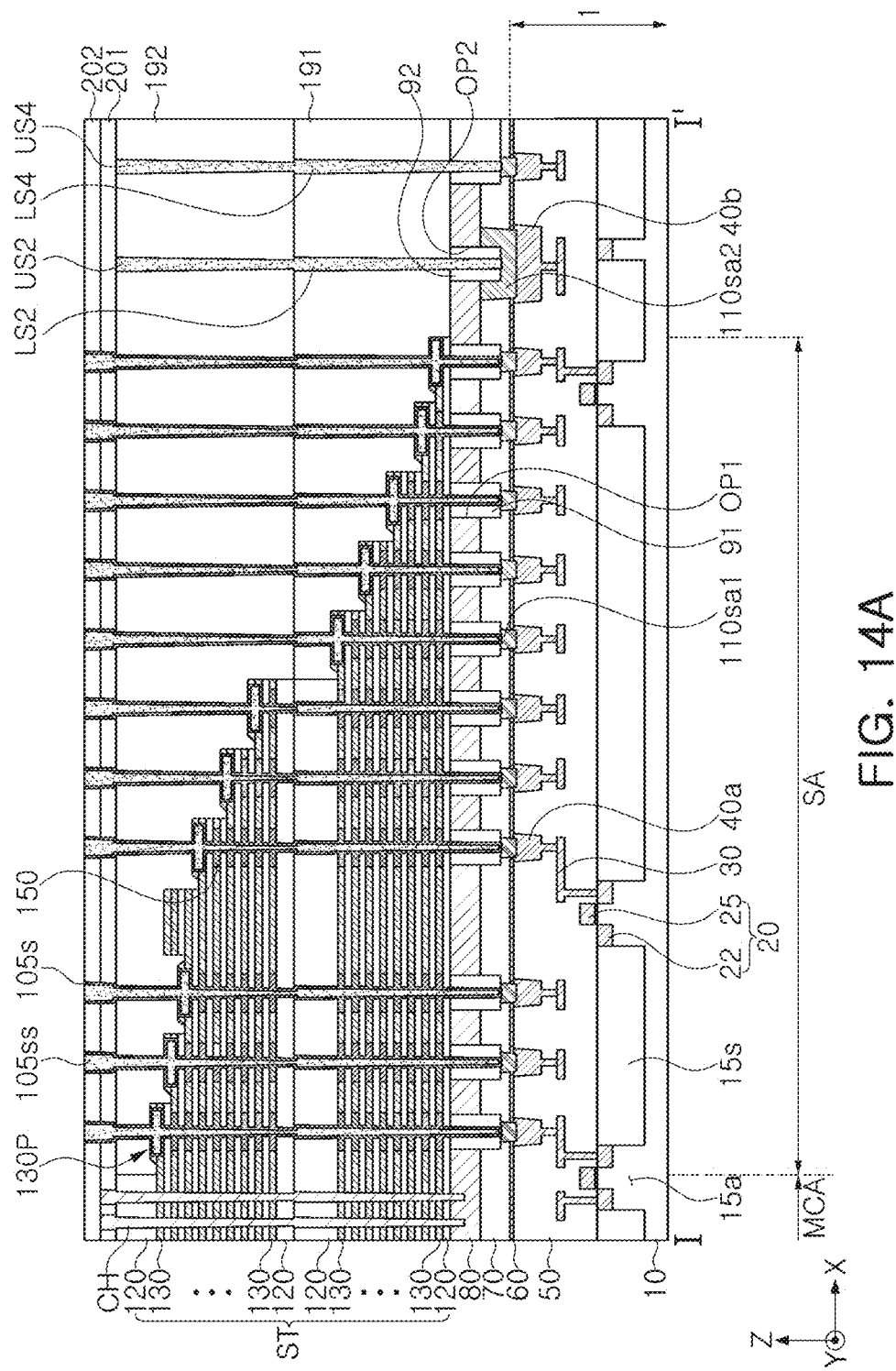
Figure 14B:
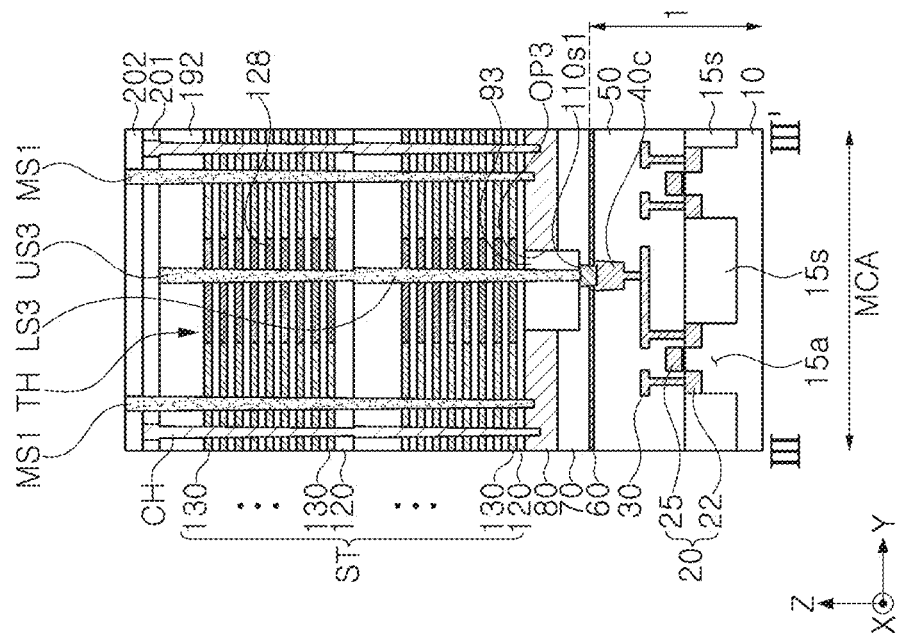
Figure 14B:
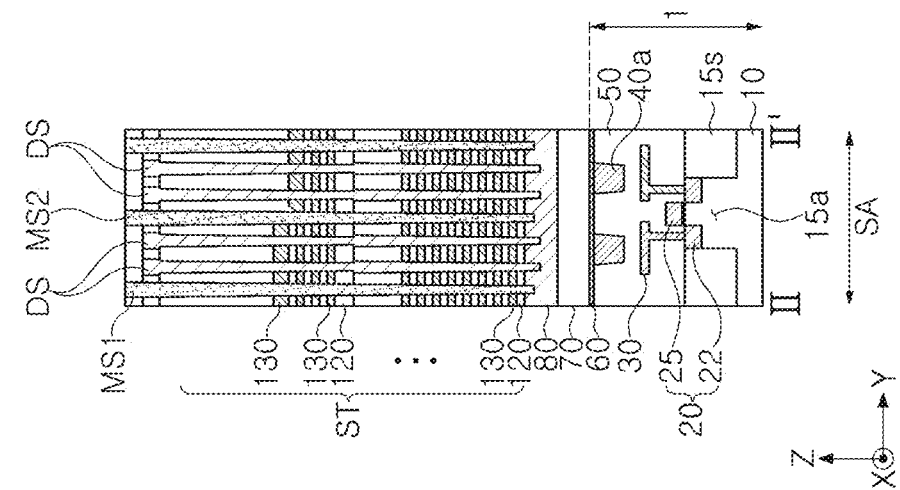

Referring to FIGS. 14A and 14B, separation trenches may be formed to extend through the lower mold structure and the upper mold structure in an X direction, the sacrificial insulating layers 128 may be removed through the separation trenches, and the gate electrodes 130 may be formed. Separation regions MS1 and MS2 may be formed to fill the separation trenches.

The gate electrodes 130 may be formed by filling regions, in which the sacrificial insulating layers 128 are removed through the trenches, with a conductive material. Accordingly, a stack structure ST in which the interlayer insulating layers 120 and the gate electrodes 130 are alternately stacked may be formed. In the first region MCA, the sacrificial insulating layers 128 may not be removed and remain between the separation trenches to form a through-region TH. In the second region SA, the gate electrodes 130 may be formed to surround the buffer insulating layer 105s in the pad regions 130P. The separation regions MS1 and MS2 may be formed of an insulating material.

Figure 15A:
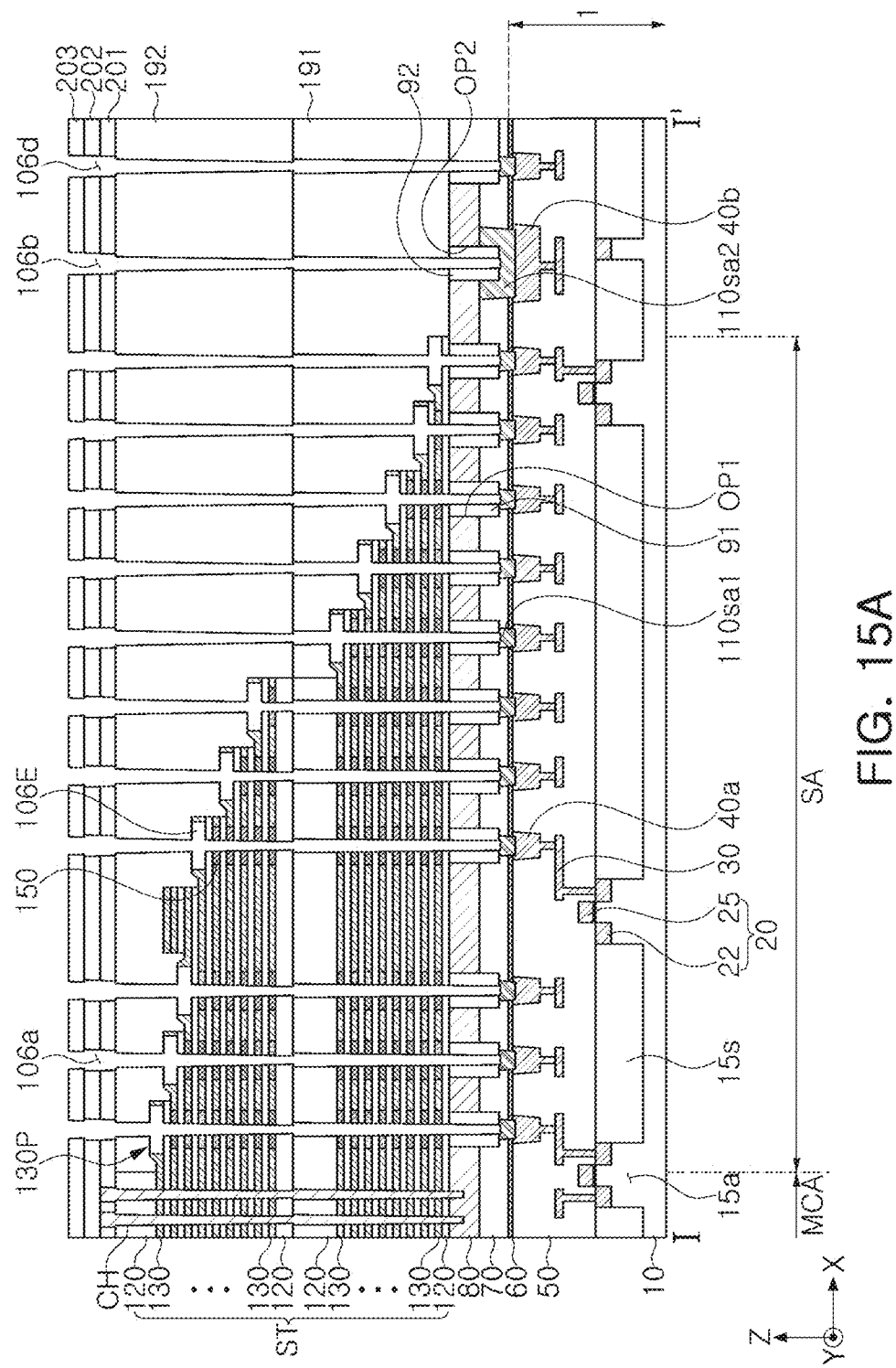
Figure 15B:
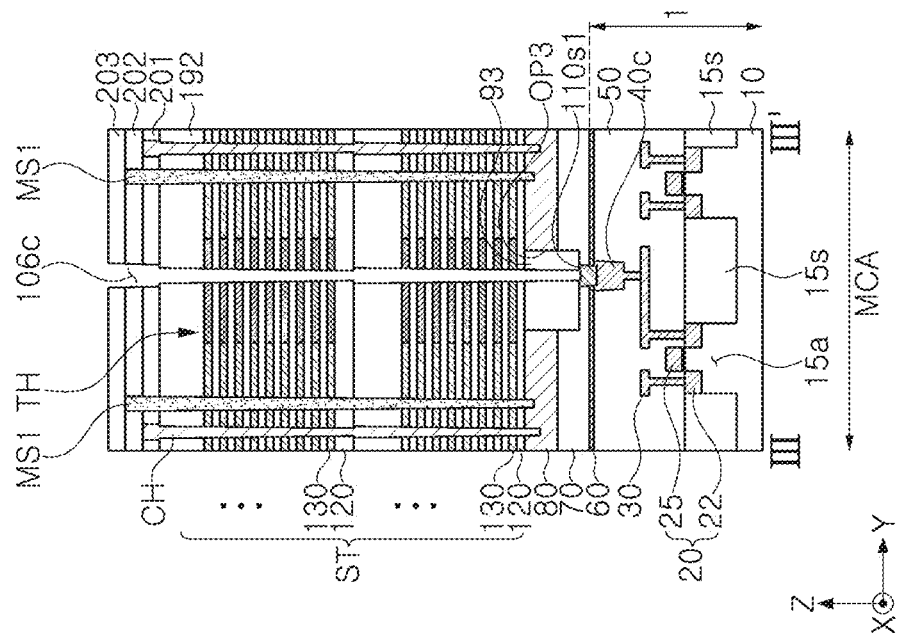
Figure 15B:
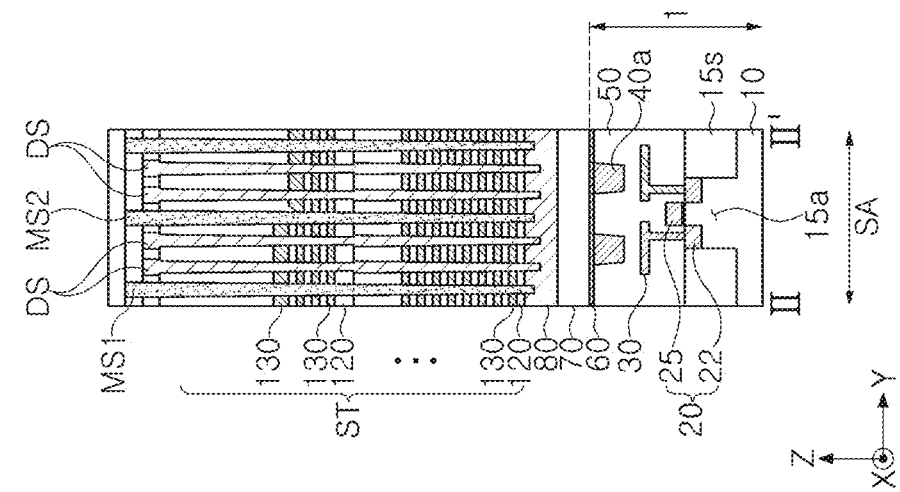

Referring to FIGS. 15A and 15B, the sacrificial gate contact plugs 105ss and the buffer insulating layer 105s may be removed to form gate contact holes 106a, and the second to fourth lower sacrificial plugs LS2, LS3, and LS4 and the second to fourth upper sacrificial plugs US2, US3, and US4 may be removed to form contact holes 106b, 106c, and 106d.

The buffer insulating patterns 150, formed below the pad extension holes 106E, may remain while removing the sacrificial gate contact plugs 105ss and removing the buffer insulating layer 105s. The gate contact holes 106a may expose the first via patterns 110sa1.

The second to fourth upper sacrificial plugs US2, US3, and US4 and the second to fourth lower sacrificial plugs LS2, LS3 and LS4 may be removed by forming a third upper insulating layer 203 on the second upper insulating layer 202 and exposing portions of the first to third upper insulating layers 201, 202, and 203 on the second to fourth upper sacrificial plugs US2, US3, and US4. The second contact hole 106b may expose the second via pattern 110sa2, and the third and fourth contact holes 106c and 106d may expose the first via patterns 110sa1.

Figure 16A:
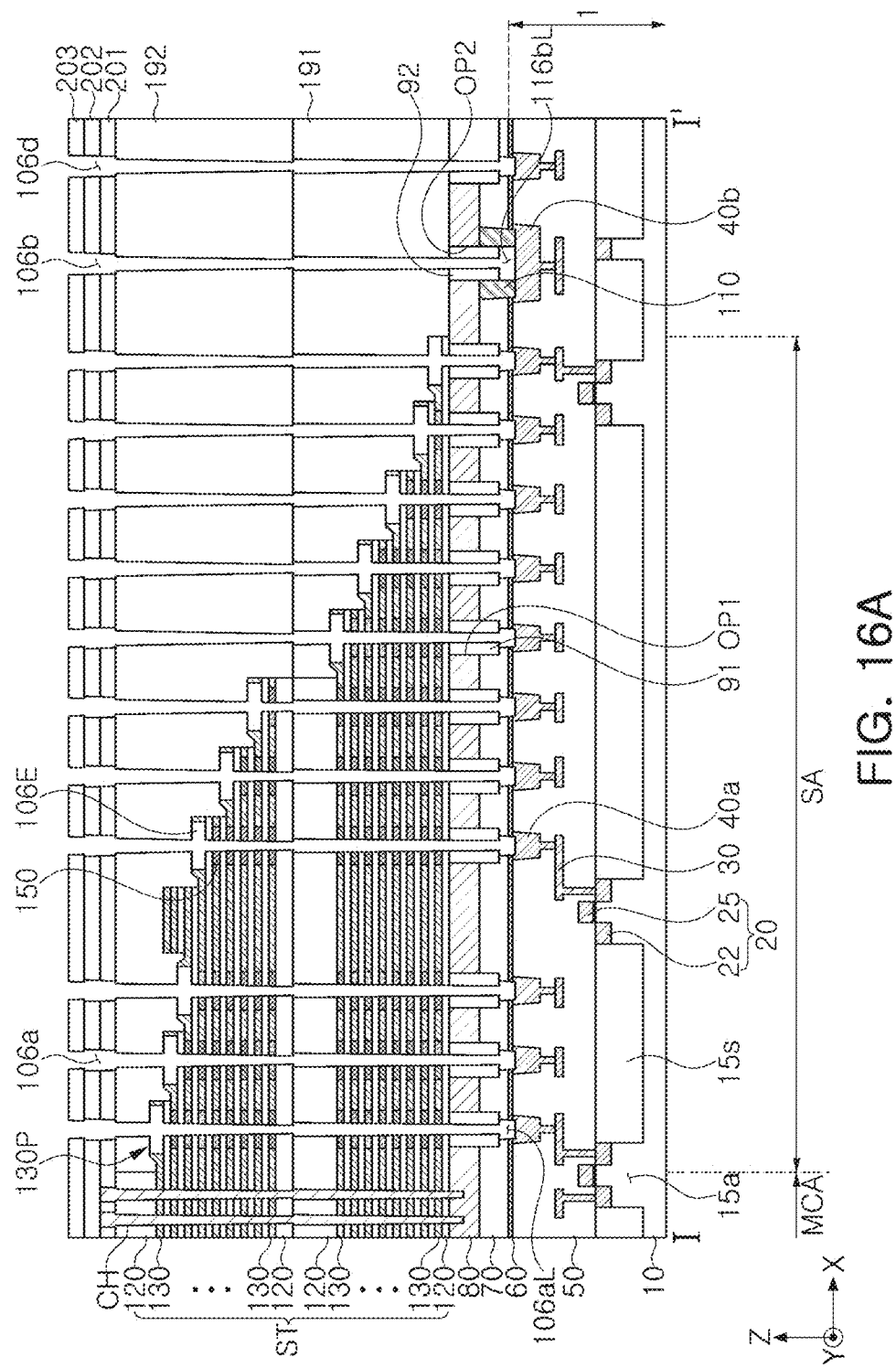
Figure 16B:
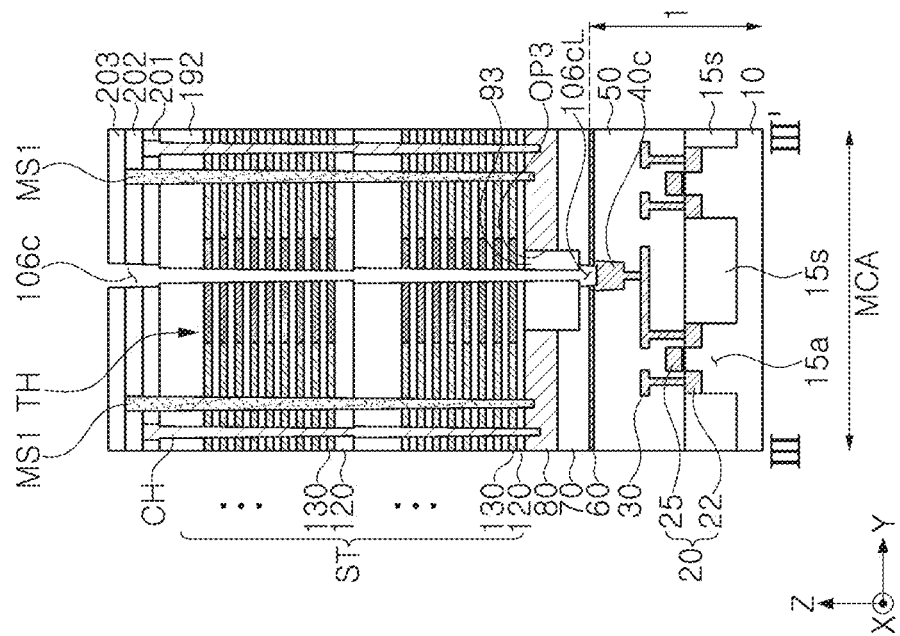
Figure 16B:
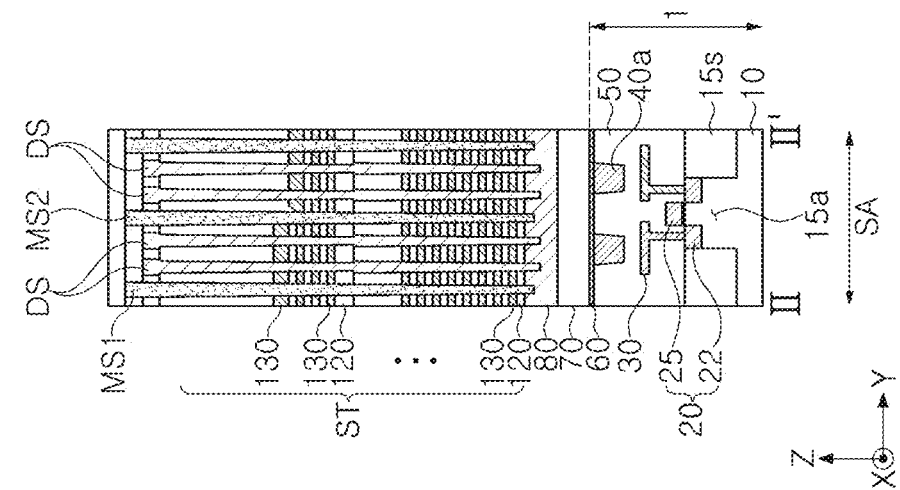

Referring to FIGS. 16A and 16B, the first via patterns 110sa1 may be removed through the gate contact holes 106a and the third and fourth contact holes 106c and 106d, and a portion of the second via pattern 110sa2 may be removed through the second contact hole 106b.

Portions of the first via patterns 110sa1 and the second via patterns 110sa2 may be removed by performing, for example, a wet etching process. A first lower extension hole 106aL and third and fourth lower extension holes 116cL and 116dL may be formed below the gate contact holes 106a and the third and fourth contact holes 106c and 106d. A semiconductor material layer, constituting the first via patterns 110sa1, may be selectively removed. As illustrated in FIG. 4B, the conductive liner 110sa may remain in the first lower extension hole 106aL.

In the second via patterns 110sa2, a portion of a semiconductor material layer may be removed to form a second lower extension hole 106bL. A portion of the second via patterns 110sa2 may be removed to form the source connection pattern 110. Since the second contact hole 106b is spaced apart from the pattern structure 80, a portion of the pattern structure 80 may be mitigated or prevented from being removed from the second contact hole 106b in a horizontal direction during the wet etching process.

Figure 17A:
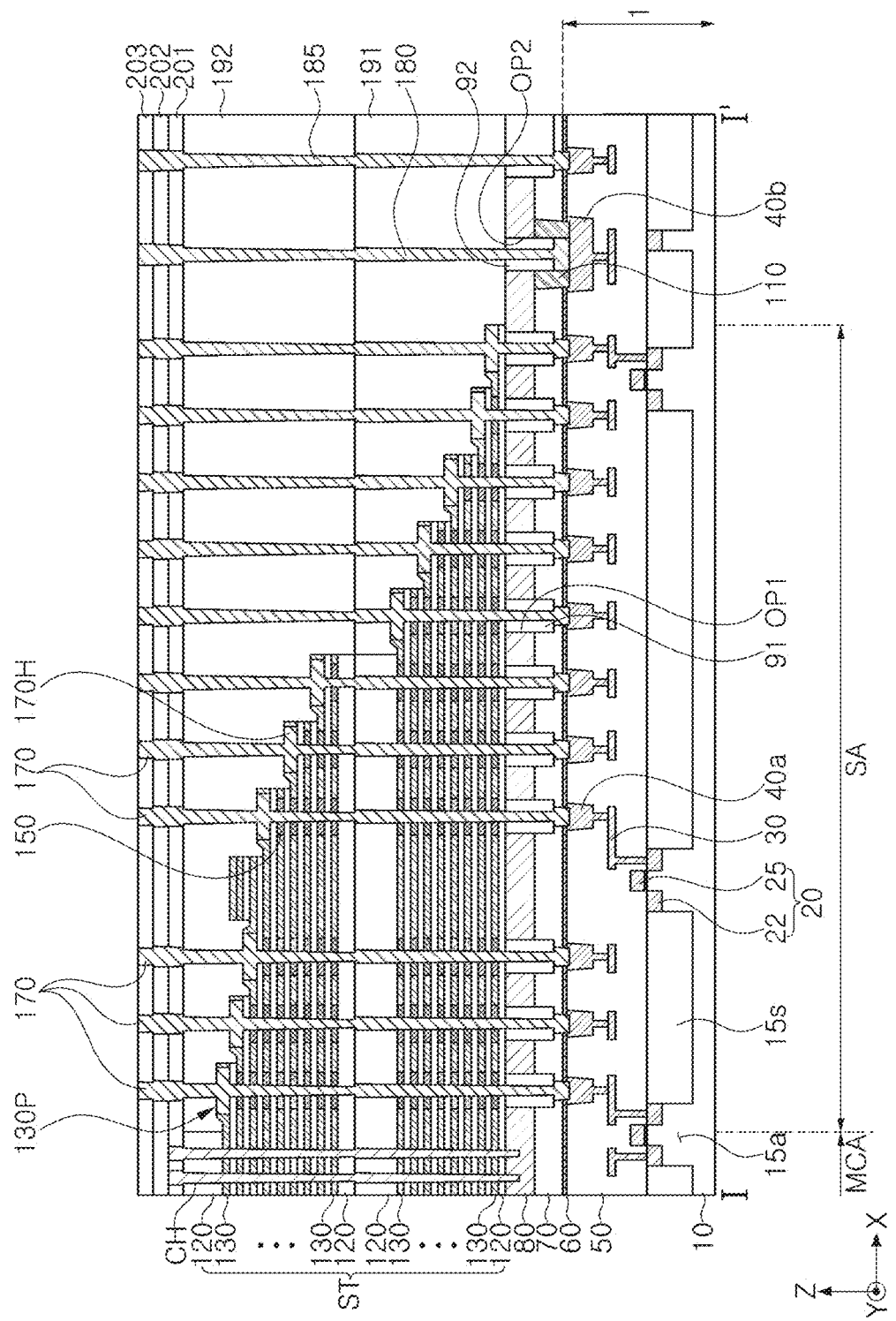
Figure 17B:
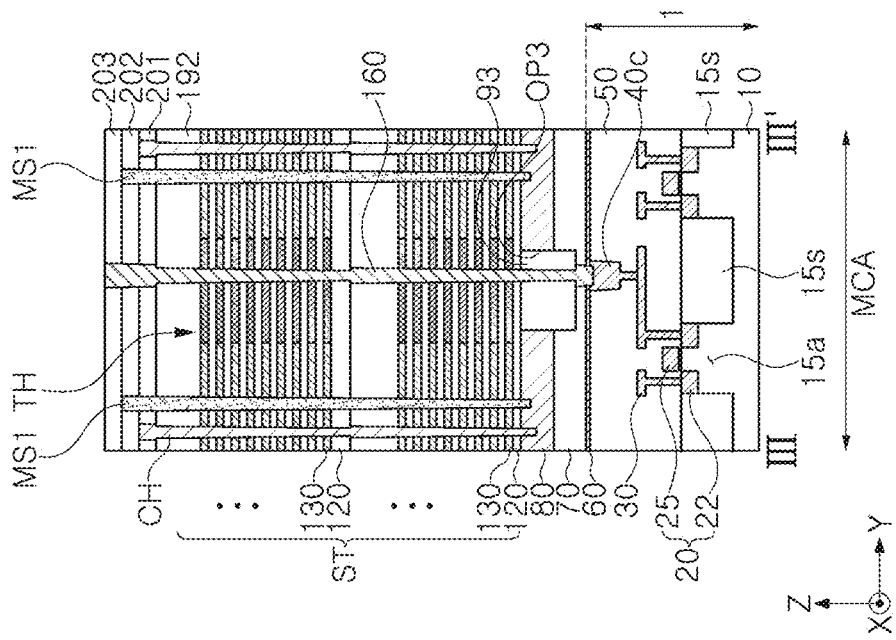
Figure 17B:
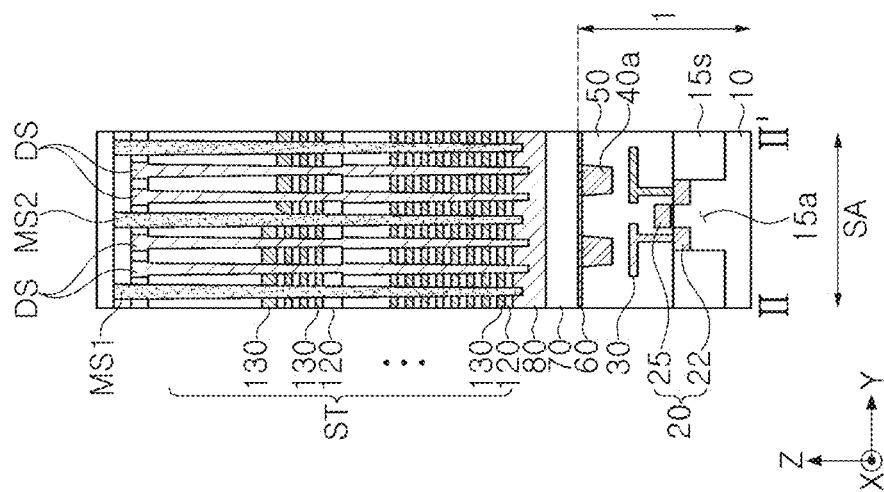

Referring to FIGS. 17A and 17B, gate contact plugs 170 may be formed to fill the gate contact holes 106a and the first lower extension hole 106aL, a source contact plug 180 may be formed to fill the second contact hole 106b and the second lower extension hole 106bL, a through-contact plug 160 may be formed to fill the third contact hole 106c and the third lower extension hole 106cL, and a peripheral contact plug 185 may be formed to fill the fourth contact hole 106d and the fourth lower extension hole 106dL.

Next, a fourth upper insulating layer 204, connection plugs 211, 212, 213, and 214, and upper interconnections 220b, 220s and 220p may be formed to fabricate the semiconductor device 100 of FIGS. 1A to 3C.

Figure 18:
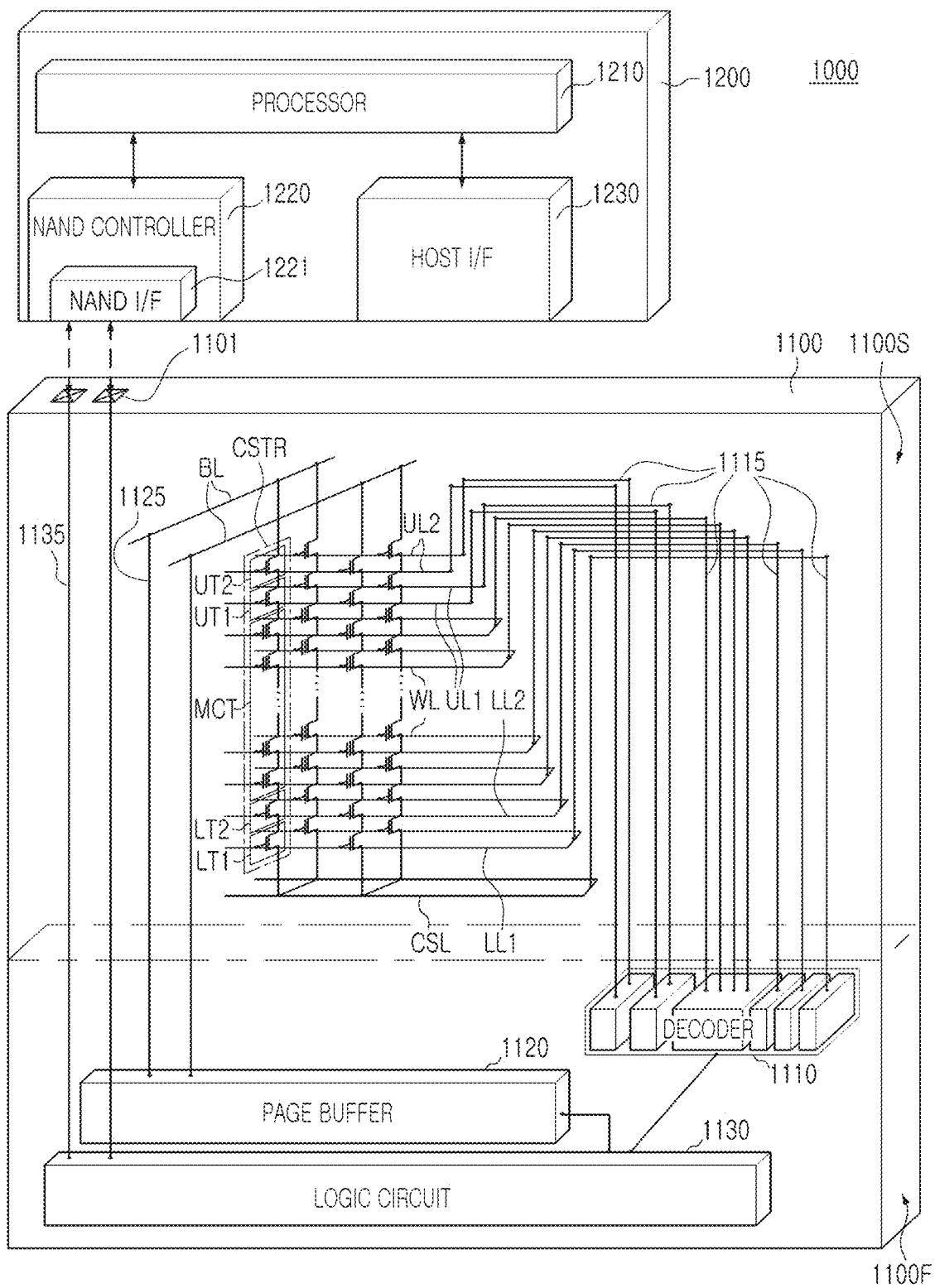
FIG. 18 is a schematic view of a data storage system including a semiconductor device according to some example embodiments.

FIG. 18 is a schematic view of a data storage system including a semiconductor device according to some example embodiments.

Referring to FIG. 18, a data storage system 1000 may include a semiconductor device 1100 and a controller 1200 electrically connected to the semiconductor device 1100. The data storage system 1000 may be implemented by a storage device including one or more semiconductor devices 1100 or an electronic device including the storage device. For example, the data storage system 1000 may be implemented by a solid state drive device (SSD) including one or more semiconductor devices 1100, a universal serial bus (USB), a computing system, a medical device, or a communication device.

The semiconductor device 1100 may be implemented as a nonvolatile memory device, and may be implemented as, for example, the NAND flash memory device described in the example embodiment described above with reference to FIGS. 1 to 7. The semiconductor device 1100 may include a first structure 1100F and a second structure 1100S on the first structure 1100F. In some example embodiments, the first structure 1100F may be disposed alongside the second structure 1100S. The first structure 1100F may be implemented as a peripheral circuit structure including a decoder circuit 1110, a page buffer 1120, and a logic circuit 1130. The second structure 1100S may be implemented as a memory cell structure including a bitline BL, common source line CSL, wordlines WL, first and second gate upper lines UL1 and UL2, first and second gate lower lines LL1 and LL2, and memory cell strings CSTR between the bitline BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may vary according to example embodiments.

In some example embodiments, the upper transistors UT1 and UT2 may include a string select transistor, and the lower transistors LT1 and LT2 may include a ground select transistor. The lower gate lines LL1 and LL2 may be configured as gate electrodes of the lower transistors LT1 and LT2, respectively. The word lines WL may be configured as gate electrodes of the memory cell transistors MCT, and the upper gate lines UL1 and UL2 may be configured as gate electrodes of the upper transistors UT1 and UT2, respectively.

In some example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 or the upper erase control transistor UT1 may be used for an erase operation of erasing data stored in the memory cell transistors MCT based on GIDL.

The common source line CSL, the first and second gate lower lines LL1 and LL2, the word lines WL, and the first and second gate upper lines UL1 and UL2 may be electrically connected to the decoder circuit 1110 through first connection lines 1115 extending from the first structure 1100F to the second structure 1100S. The bitlines BL may be electrically connected to the page buffer 1120 through second connection lines 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input and output pad 1101 electrically connected to the logic circuit 1130. The input and output pad 1101 may be electrically connected to the logic circuit 1130 through an input and output connection interconnection 1135 extending from the first structure 1100F to the second structure 1100S.

The controller 1200 may include a processor 1210, a NAND controller 1220, and a host interface 1230. In some example embodiments, the data storage system 1000 may include a plurality of semiconductor devices 1100. In this case, the controller 1200 may control the plurality of semiconductor devices 1100.

The processor 1210 may control overall operations of the data storage system 1000 including the controller 1200. The processor 1210 may operate according to a desired (or alternatively, predetermined) firmware, and may access the semiconductor device 1100 by controlling the NAND controller 1220. The NAND controller 1220 may include a NAND interface 1221 for processing communication with the semiconductor device 1100. Through the NAND interface 1221, a control command for controlling the semiconductor device 1100, data to be written in the memory cell transistors MCT of the semiconductor device 1100, and data to be read from the memory cell transistors MCT may be transmitted. The host interface 1230 may provide a communication function between the data storage system 1000 and an external host. When a control command is received from an external host through the host interface 1230, the processor 1210 may control the semiconductor device 1100 in response to the control command.

Figure 19:
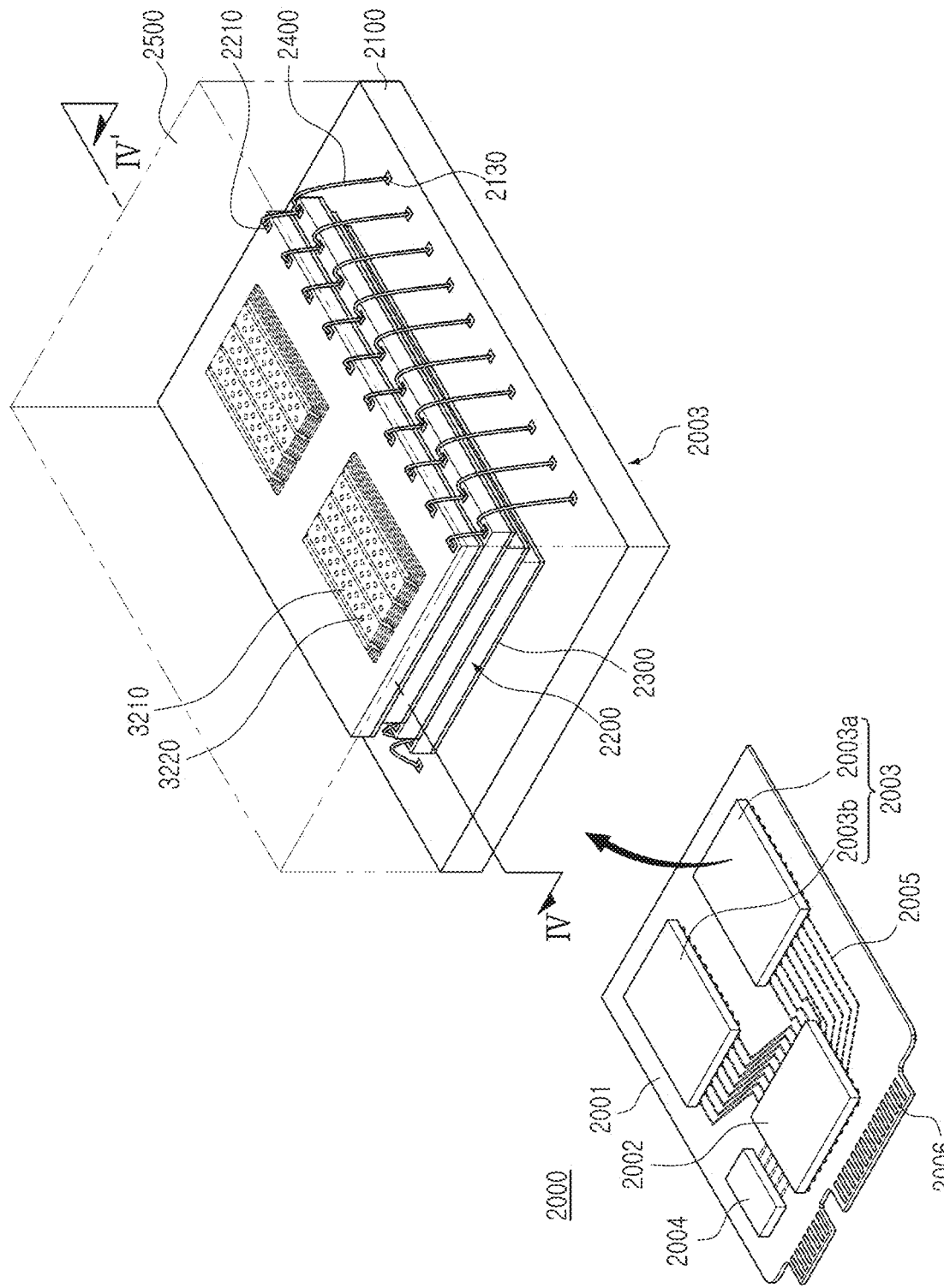
FIG. 19 is a schematic perspective view of a data storage system including a semiconductor device according to some example embodiments.

FIG. 19 is a schematic perspective view of a data storage system including a semiconductor device according to some example embodiments.

Referring to FIG. 19, a data storage system 2000 in an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and the arrangement of the plurality of pins in the connector 2006 may vary depending on a communication interface between the data storage system 2000 and an external host. In some example embodiments, the data storage system 2000 may communicate with an external host according to one of interfaces such as universal serial bus (USB), peripheral component interconnect express (PCI-Express), serial advanced technology attachment (SATA), M-PHY for universal flash storage (UFS), and the like. In some example embodiments, the data storage system 2000 may be operated by power supplied from an external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be implemented as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, and adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including the package upper pads 2130. Each semiconductor chip 2200 may include an input and output pad 2210. The input and output pad 2210 may correspond to the input and output pad 1101 in FIG. 16 and may include the conductive pad 270 in FIG. 2. Each of the semiconductor chips 2200 may include gate stack structures 3210 and channel structures 3220. Each of the semiconductor chips 2200 may include the semiconductor device described in the example embodiment described above with reference to FIGS. 1A to 7.

In some example embodiments, the connection structure 2400 may be configured as a bonding wire electrically connecting the input and output pad 2210 to the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In some example embodiments, in each of the first and second semiconductor packages 2003a and 2003b, the semiconductor chips 2200 may be electrically connected to each other by a connection structure including a through-silicon via (TSV), rather than the connection structure 2400 of a bonding wire type.

In some example embodiments, the controller 2002 and the semiconductor chips 2200 may be included in a single package. In an example embodiment, the controller 2002 and the semiconductor chips 2200 may be mounted on an interposer substrate separate from the main substrate 2001, and the controller 2002 may be connected to the semiconductor chips 2200 by an interconnection formed on the interposer substrate.

Figure 20:
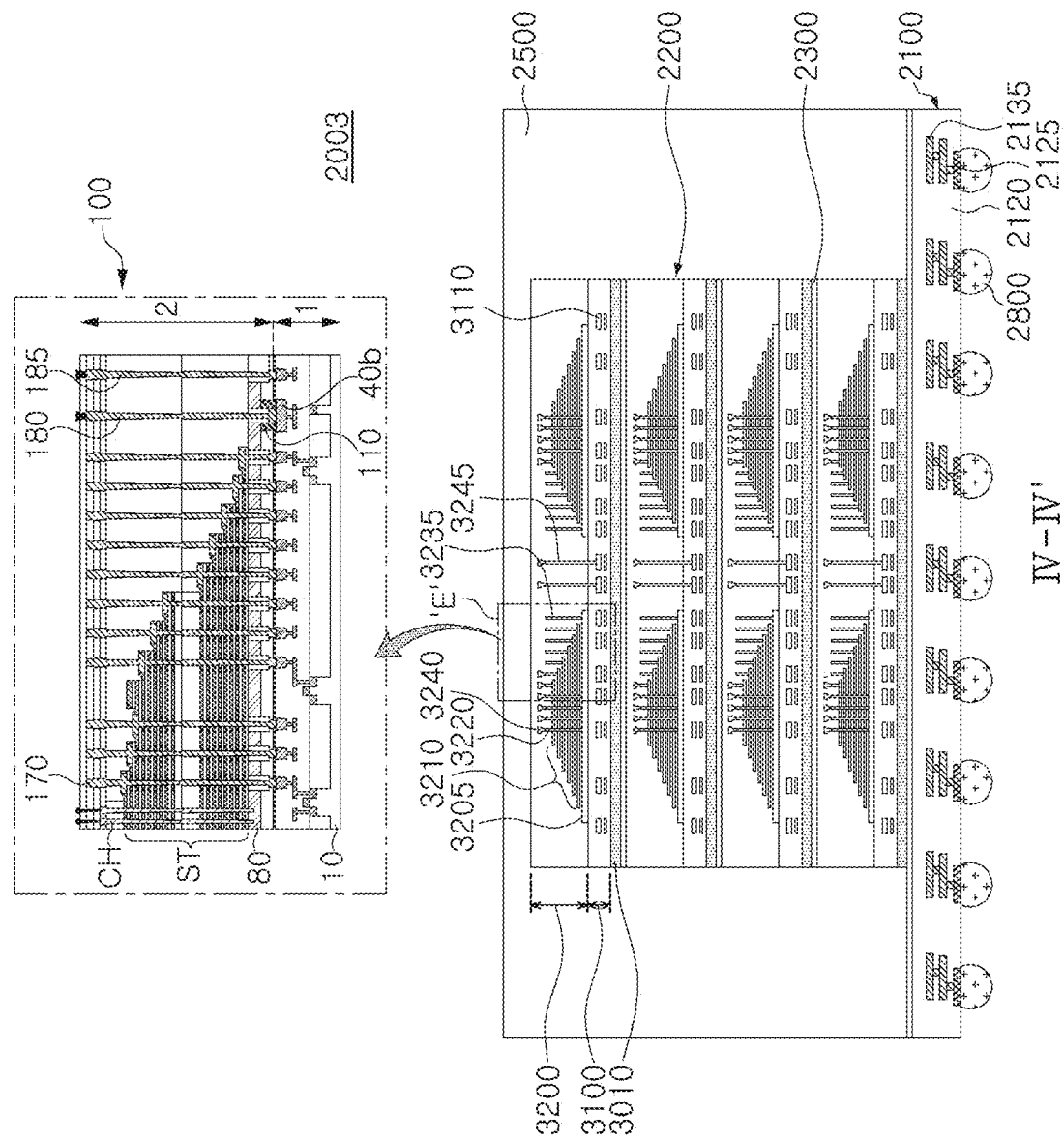
FIG. 20 is a schematic cross-sectional view of a semiconductor package according to some example embodiments.

FIG. 20 is a schematic cross-sectional view of a semiconductor package according to some example embodiments. FIG. 20 illustrates an example embodiment of the semiconductor package 2003 in FIG. 19, conceptually illustrating the semiconductor package 2003 in FIG. 19 taken along line IV-IV'.

Referring to FIG. 20, in a semiconductor package 2003, a package substrate 2100 may be configured as a printed circuit board. The package substrate 2100 may include a package substrate body portion 2120, package upper pads 2130 (see FIG. 19) disposed on the upper surface of the package substrate body portion 2120, lower pads 2125 disposed on or exposed through the lower surface of the package substrate body portion 2120, and internal interconnections 2135 electrically connecting the upper pads 2130 to the lower pads 2125 in the package substrate body 2120. The upper pads 2130 may be electrically connected to the connection structures 2400. The lower pads 2125 may be connected to the interconnection patterns 2005 of the main substrate 2010 of the data storage system 2000 as illustrated in FIG. 19 through conductive connection portions 2800.

Each of the semiconductor chips 2200 may include a semiconductor substrate 3010, and a first structure 3100 and a second structure 3200 stacked in order on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and separation regions 3230 penetrating the gate stack structure 3210, bit lines 3240 electrically connected to the memory channel structures 3220, and gate contact plugs 3235 electrically connected to the word lines WL (see FIG. 18) of the gate stack structure 3210. As described in the example embodiment described above with reference to FIGS. 1A to 7, in each of the semiconductor chips 2200, a semiconductor device 100 may include a substrate 10, a pattern structure 80, a stack structure ST including gate electrodes 130, a channel structure CH, gate contact plugs 170, a source connection pattern 110, a source contact plug 180, and a second pad layer 40b.

Each of the semiconductor chips 2200 may include a through-interconnection 3245 electrically connected to the peripheral interconnections 3110 of the first structure 3100 and extending into the second structure 3200. The through-interconnection 3245 may be disposed on an external side of the gate stack structure 3210, and may be further disposed to penetrate through the gate stack structure 3210. Each of the semiconductor chips 2200 may further include an input/output pad 2210 (see FIG. 19) electrically connected to the peripheral interconnections 3110 of the first structure 3100.

As described above, a source contact plug and a pattern structure may be electrically connected to each other through a source connection pattern and a pad layer. Accordingly, a semiconductor device having improved integration density and productivity and a data storage system including the same may be provided.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been shown and described above, it will be apparent to those skilled in the art that modifications and variations could be made without departing from the scope of the present inventive concepts as defined by the appended claims.

What is claimed is:
1. A semiconductor device comprising:
a first structure including a substrate, circuit devices on the substrate, first pad layers on the circuit devices, and a second pad layer on the circuit devices; and
a second structure on the first structure,
wherein the second structure comprises,
first conductive layer including first openings on corresponding ones of the first pad layers, respectively, and a second opening on the second pad layer, the first conductive layer having a first region and a second region, a stack structure including gate electrodes spaced apart from each other on the first region and the second region, the gate electrodes stacked on the first conductive layer in a vertical direction and extending in a first direction perpendicular to the vertical direction, channel structures penetrating through the stack structure on the first region, each of the channel structures including a channel layer, separation regions penetrating through the stack structure on the first region and the second region and extending in the first direction, gate contact plugs penetrating through the stack structure, the gate contact plugs connected to the gate electrodes, respectively, and the gate contact plugs connected to the first pad layers through the first openings of the first conductive layer, respectively, a source connection conductive layer being in contact with a lower surface of the first conductive layer, and the source connection conductive layer having a hole between the second opening of the first conductive layer and the second pad layer, a source contact plug spaced apart from the stack structure, the source contact plug extending into the hole of the source connection conductive layer through the second opening of the first conductive layer, and the source contact plug connected to the second pad layer and the source connection conductive layer, and a through-insulating layer in the second opening of the first conductive layer and surrounding a side surface of the source contact plug while extending partially into the hole of the source connection conductive layer.

2. The semiconductor device of claim 1, wherein the source contact plug is spaced apart from the first conductive layer by the through-insulating layer and is electrically connected to the first conductive layer through the second pad layer and the source connection conductive layer.

3. The semiconductor device of claim 1, wherein
the source contact plug includes a first plug portion below the first conductive layer and a second plug portion on the first plug portion, and
a first width of the first plug portion is greater than a second width of the second plug portion.

4. The semiconductor device of claim 3, wherein
the first plug portion is in direct contact with the source connection conductive layer, and
the second plug portion is spaced apart from the source connection conductive layer in a horizontal direction.

5. The semiconductor device of claim 1, wherein
each of the first conductive layer and the source connection conductive layer includes a semiconductor material, and
each of the second pad layer and the source contact plug includes at least one of metal and metal nitride.

6. The semiconductor device of claim 1, wherein
the source contact plug includes a conductive plug and a conductive liner covering a side surface and a lower surface of the conductive plug, and
the conductive liner includes a vertical portion and a bent portion, the vertical portion extending downwardly through the first conductive layer in the vertical direction, the bent portion bent toward the source connection conductive layer from the vertical portion.

7. The semiconductor device of claim 1, wherein
each of the gate contact plugs includes a first gate plug portion and a second gate plug portion on the first gate plug portion and below the first openings, and
a third width of the first gate plug portion is greater than a fourth width of the second gate plug portion.

8. The semiconductor device of claim 7, wherein
each of the gate electrodes includes a pad region having an upper surface, the upper surface including a portion exposed upwardly in the second region,
each of the gate contact plugs includes a vertical extension portion and a horizontal extension portion, the vertical extension portion extending from the second gate plug portion in the vertical direction, the horizontal extension portion horizontally extending from the vertical extension portion and in contact with the pad region, and
the stack structure further includes buffer insulating patterns below the horizontal extension portion and insulating the gate electrodes and the vertical extension portion from each other.

9. A semiconductor device comprising:
a first structure including a substrate, circuit devices on the substrate, and first pad layers on the circuit devices, and a second pad layer on the circuit devices; and
a second structure on the first structure,
wherein the second structure comprises,
a first conductive layer including first openings on corresponding ones of the first pad layers, respectively, and a second opening on the second pad layer, the first conductive layer having a first region and a second region,
gate electrodes spaced apart from each other and stacked on the first conductive layer in a vertical direction and extending in a first direction perpendicular to the vertical direction, each of the gate electrodes including a pad region having an upper surface, the upper surface including a portion exposed upwardly in the second region,
channel structures penetrating through the gate electrodes on the first region, each of the channel structures extending in the vertical direction and including a channel layer,
gate contact plugs electrically connected to the gate electrodes, respectively, through the pad region of each of the gate electrodes, the gate contact plugs extending in the vertical direction to pass through corresponding ones of the first openings of the first conductive layer, respectively, and connected to corresponding ones of the first pad layers, respectively,
a source contact plug spaced apart from the gate electrodes, extending in the vertical direction to pass through the second opening of the first conductive layer, and connected to the second pad layer, and
a source connection conductive layer having an upper surface in contact with a lower surface of the first conductive layer, the source connection conductive layer in contact with the source contact plug and the second pad layer.

10. The semiconductor device of claim 9, wherein the source contact plug is spaced apart from the first conductive layer in the second opening, and is electrically connected to the first conductive layer through the second pad layer and the source connection conductive layer.

11. The semiconductor device of claim 9, wherein a lower surface of the source contact plug is on a lower level than the lower surface of the first conductive layer.

12. The semiconductor device of claim 9, wherein the source connection conductive layer surrounds a lower portion of the source contact plug below the first conductive layer.

13. The semiconductor device of claim 9, wherein
the source connection conductive layer has a hole penetrating through at least a portion of the source connection conductive layer below the second opening of the first conductive layer, and
the source contact plug extends into the hole of the source connection conductive layer.

14. The semiconductor device of claim 13, wherein
the source contact plug includes a first plug portion below the first conductive layer and a second plug portion on the first plug portion,
the first plug portion is in direct contact with the source connection conductive layer, and
the second plug portion is spaced apart from the source connection conductive layer in a horizontal direction in the hole.

15. The semiconductor device of claim 14, wherein a first width of the first plug portion is greater than a second width of the second plug portion.

16. The semiconductor device of claim 14, wherein the source contact plug further includes a third plug portion protruding downwardly from the first plug portion.

17. The semiconductor device of claim 9, wherein a side surface of each of the gate contact plugs includes a bent portion below the first openings.

18. The semiconductor device of claim 9, further comprising:
buffer insulating patterns surrounding side surfaces of the gate contact plugs, each of the buffer insulating patterns being below the pad region of a corresponding one of the gate electrodes.

19. A data storage system comprising:
a semiconductor storage device including,
a first structure including a substrate, circuit devices on the substrate, and first pad layers on the circuit devices, and a second pad layer on the circuit devices,
a second structure on the first structure, the second structure including,
a first conductive layer including first openings on corresponding ones of the first pad layers, respectively, and a second opening on the second pad layer, the first conductive layer having a first region and a second region,
gate electrodes spaced apart from each other and stacked on the first conductive layer in a vertical direction and extending in a first direction perpendicular to the vertical direction, each of the gate electrodes including a pad region having an upper surface, the upper surface including a portion exposed upwardly in the second region,
channel structures penetrating through the gate electrodes on the first region, each of the channel structures extending in the vertical direction and including a channel layer,
gate contact plugs electrically connected to the gate electrodes, respectively, through the pad region of each of the gate electrodes, the gate contact plugs extending in the vertical direction to pass through corresponding ones of the first openings of the first conductive layer, respectively, and connected to corresponding ones of the first pad layers, respectively,
a source contact plug spaced apart from the gate electrodes, extending in the vertical direction to pass through the second opening of the first conductive layer, and connected to the second pad layer, and
a source connection conductive layer having an upper surface in contact with a lower surface of the first conductive layer and in contact with the source contact plug and the second pad layer, and
an input/output pad electrically connected to the circuit devices; and
a controller electrically connected to the semiconductor storage device through the input/output pad and configured to control the semiconductor storage device.

20. The data storage system of claim 19, wherein
the source connection conductive layer has a hole penetrating through at least a portion of the source connection conductive layer below the second opening of the first conductive layer, and
the semiconductor storage device further includes a through-insulating layer in the second opening of the first conductive layer, the through-insulating layer surrounding a side surface of the source contact plug while extending partially into the hole of the source connection conductive layer.

* * * * *